United States Patent [19]

Ikeyama et al.

[11] Patent Number: 5,986,715
[45] Date of Patent: *Nov. 16, 1999

[54] RATE CONVERTER USING A REGISTER POSTFIX TYPE TRANSVERSAL FILTER

[75] Inventors: Hiromasa Ikeyama; Taku Kihara; Shigetoshi Nohda, all of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/815,884

[22] Filed: Mar. 12, 1997

Related U.S. Application Data

[62] Division of application No. 08/338,483, filed as application No. PCT/JP94/00402, Mar. 14, 1994.

[30] Foreign Application Priority Data

Mar. 23, 1993 [JP] Japan .................................. 5-086902

[51] Int. Cl.[6] ....................................... H04N 5/91
[52] U.S. Cl. ...................... 348/441; 364/724.16; 386/131
[58] Field of Search ...................... 386/131, 46; 348/441, 348/458, 459, 720, 222, 445; 364/724.01, 74.1, 724.13, 724.16, 723; H04N 5/91

[56] References Cited

U.S. PATENT DOCUMENTS

| | | | |
|---|---|---|---|
| 4,609,941 | 9/1986 | Carr et al. ................................ | 348/415 |
| 4,748,578 | 5/1988 | Lagadec et al. ...................... | 364/724.1 |
| 4,777,612 | 10/1988 | Tomimitsu ......................... | 364/724.13 |
| 5,272,524 | 12/1993 | Nagumo et al. . | |
| 5,307,156 | 4/1994 | Yamamoto et al. ..................... | 348/445 |
| 5,335,194 | 8/1994 | Clayton et al. ....................... | 364/724.1 |
| 5,408,266 | 4/1995 | Ikeyama et al. ......................... | 348/222 |
| 5,461,604 | 10/1995 | Hasegawa ............................. | 364/724.1 |
| 5,475,436 | 12/1995 | Watanabe et al. ....................... | 348/441 |
| 5,517,247 | 5/1996 | Correa et al. ........................... | 348/448 |
| 5,517,248 | 5/1996 | Isoda ...................................... | 348/459 |

FOREIGN PATENT DOCUMENTS

| | | |
|---|---|---|
| 58-97968 | 6/1983 | Japan . |
| 62-172807 | 7/1987 | Japan . |
| 1-268305 | 10/1989 | Japan . |
| 5-7130 | 1/1993 | Japan . |

OTHER PUBLICATIONS

John G. Proakis et al. [Introduction to Digital Signal Processing], 1989, MacMillan Publishing Co., New York *paragraph 8.5.4*.

*Primary Examiner*—Tommy P. Chin
*Assistant Examiner*—Y. Lee
*Attorney, Agent, or Firm*—Frommer Lawrence & Haug, LLP.; William S. Frommer

[57] ABSTRACT

(M–N) 0 data are inserted for every N data of the $f_{SL}$ input data by an interpolation circuit 20 for generating $f_{SH}$ rate data, while filter coefficients are sequentially generated by M coefficient generators 30A to 30D at the $f_{SH}$ rate. A register postfix type transversal filter 40 effectuates up rate conversion of N:M (N<M) of generating $f_{SH}$ rate output data from $f_{SL}$ rate input data. The transversal filter 40 includes M multipliers 41A to 41D for multiplying the $f_{SH}$ rate data generated by the interpolation circuit 20 with the filter coefficients sequentially applied by the coefficient generators 30A to 30D and each (M–1) delay circuits 42A to 42C and additive units 43A to 43C for delaying product outputs of the multipliers 41A to 41D by unit time delay and summing the delayed product output together.

2 Claims, 23 Drawing Sheets

FIG.5(A)
(PRIOR ART)
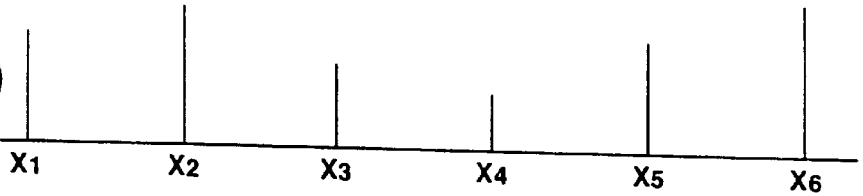
X1   X2   X3   X4   X5   X6
FIG.5(B)
(PRIOR ART)
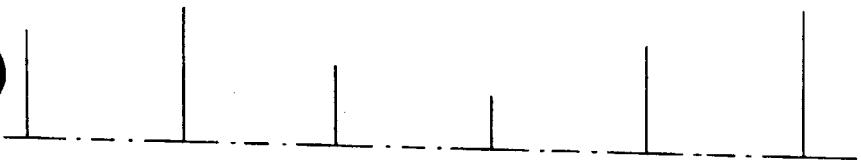
FIG.5(C)
(PRIOR ART)
k0  k1  k2  k3  k4  k5  k6  k7  k8  k9  k10  k11  k12  k13  k14
k0  k1  k2  k3  k4  k5  k6  k7  k8  k9  k10  k11  k12  k13  k14
k0  k1  k2  k3  k4  k5  k6  k7  k8  k9  k10  k11  k12  k13  k14
FIG.5(D)
(PRIOR ART)
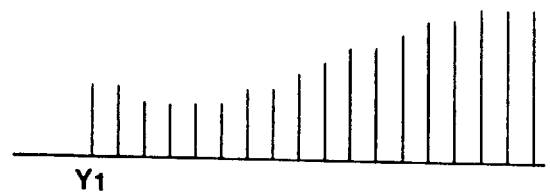
Y1
FIG.5(E)
(PRIOR ART)
Y1   Y6   Y11   Y16

FIG.6(A) (PRIOR ART)
X1　　　X2　　　X3　　　X4
FIG.6(B) (PRIOR ART)
FIG.6(C) (PRIOR ART)
k0 k1 k2 k3 k4 k5 k6 k7 k8 k9 k10 k11 k12 k13 k14
k0 k1 k2 k3 k4 k5 k6 k7 k8 k9 k10 k11 k12 k13 k14
k0 k1 k2 k3 k4 k5 k6 k7 k8 k9 k10 k11 k12 k13 k14
FIG.6(D) (PRIOR ART)
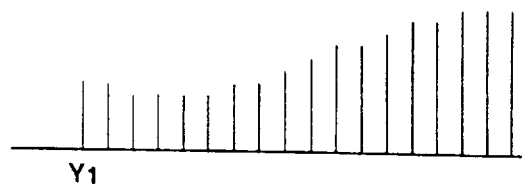
Y1
FIG.6(E) (PRIOR ART)
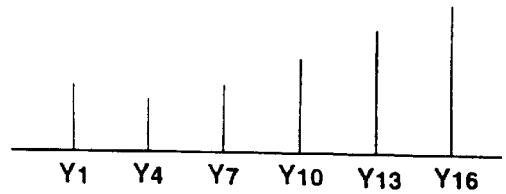
Y1　Y4　Y7　Y10　Y13　Y16

RATE CONVERTER USING A REGISTER POSTFIX TYPE TRANSVERSAL FILTER

This application is a division of application Ser. No. 08/338,483, filed Jan. 27, 1995 U.S. Pat. No. 5,680,335, filed as PCT/JP94/00402on Mar. 14, 1994.

TECHNICAL FIELD

This invention relates to a rate converter for converting the rate of data for exchanging data between digital circuits operating at two different clock rates, and to an imaging apparatus provided with the rate converter.

BACKGROUND ART

In general, for exchanging data between two digital circuits operating at different clock rates, a rate converter is needed for converting the data rate.

For example, when exchanging digital video signals between a digital video signal processing circuit of an imager operating at a clock rate of 18 MHz and a digital video signal processing circuit of a digital video tape recorder (RVTR) operating at a clock rate of 13.5 MHz pursuant to D1 standard, a rate converter, such as a 4:3-down rate converter for converting the rate of digital video signal outputted from the imager from 18 MHz to 13.5 MHz, or a 3:4-up rate converter for converting the rate of digital video signals outputted from the DVTR from 13.5 MHz to 18 MHz, is needed.

The-imager employing a solid-state imaging device usually has a clock rate determined by the number of pixels of the solid-state imaging device. For example, with an imager employing 500,000 pixel solid imaging devices, the digital video signal processing circuit operates at a clock rate of 18 MHz.

With the conventional rate converter, output data of a desired output clock rate is obtained by upconverting input data to a clock rate equal to the least common multiple of the input clock rate and the output clock rate and by thinning out via a, filter. Thus the conventional rate converter is in need of filtering at the output clock rate equal to the above-mentioned least common multiple.

For example, with a 4:3-down rate converter, input data at the 18 MHz clock rate is converted by the filtering shown in FIGS. 1 and 2 into output data having the clock rate of 13.5 MHz.

That is, with the 4:3-down rate converter, zero data is inserted at the positions of 18 MHz clock rate input data $\{X_m\}$ shown at A in FIG. 1 which can become sampling points for 13.5 MHz as shown at B in FIG. 1 for upconverting the input data to the clock rate of a frequency equal to the least common multiple of 18 MHz and 13.5 MHz, that is 54 MHz. Thus, in the frequency domain, the frequency components repeated on the basis of 18 MHz as shown at A in FIG. 2 are now repeated at the unit of repetition of 54 MHz, with the frequency characteristics remaining unchanged, as shown at B in FIG. 2.

The 54 MHz clock rate data is then passed through a filter having characteristics shown at C in FIG. 1 and at C in FIG. 2. That is, since the output clock rate is 13.5 MHz, should there be frequency components of not less than 6.75 MHz (one-half of 13.5 MHz) up to 27 MHz (one-half of 54 MHz), aliasing is produced when the clock rate is set to 13.5 MHz, and hence original frequency characteristics cannot be maintained. Consequently, the data is passed through a low-pass filter for suppressing frequency components not less than 6.75 MHz.

The data $\{Y_i\}$ at the clock rate of 54 MHz, having frequency components not less than 6.75 MHz suppressed, is obtained as data $Y_1$ to $Y_{14}$, that is, $Y_1 = k_2 \cdot X_4 + k_5 \cdot X_3 + k_8 \cdot X_2 + k_{11} \cdot X_1$ $Y_2 = k_0 \cdot X_5 + k_3 \cdot X_4 + k_6 \cdot X_3 + k_9 \cdot X_2$ $Y_3 = k_1 \cdot X_5 + k_4 \cdot X_4 + k_7 \cdot X_3 + k_{10} \cdot X_2$ $Y_4 = k_2 \cdot X_5 + k_5 \cdot X_4 + k_8 \cdot X_3 + k_{11} \cdot X_2$ $Y_5 = k_0 \cdot X_6 + k_3 \cdot X_5 + k_6 \cdot X_4 + k_9 \cdot X_3$ $Y_6 = k_1 \cdot X_6 + k_4 \cdot X_5 + k_7 \cdot X_4 + k_{10} \cdot X_3$ $Y_7 = k_2 \cdot X_6 + k_5 \cdot X_5 + k_8 \cdot X_4 + k_{11} \cdot X_3$ $Y_8 = k_0 \cdot X_7 + k_3 \cdot X_6 + k_6 \cdot X_5 + k_9 \cdot X_4$ $Y_9 = k_1 \cdot X_7 + k_4 \cdot X_6 + k_7 \cdot X_5 + k_{10} \cdot X_4$ $Y_{10} = k_2 \cdot X_7 + k_5 \cdot X_6 + k_3 \cdot X_5 + k_{11} \cdot X_4$ $Y_{11} = k_0 \cdot X_8 + k_3 \cdot X_7 + k_6 \cdot X_6 + k_9 \cdot X_5$ $Y_{12} = k_1 \cdot X_8 + k_4 \cdot X_7 + k_7 \cdot X_6 + k_{10} \cdot X_5$ $Y_{13} = k_2 \cdot X_8 + k_5 \cdot X_7 + k_8 \cdot X_6 + k_{11} \cdot X_5$ $Y_{14} = k_0 \cdot X_9 + k_3 \cdot X_8 + k_6 \cdot X_7 + k_9 \cdot X_6$ by filtering input data $X_m \times z^m \cdot X_1$ with a transfer function represented by the formula (1)

$$F_1(z) = \sum_{i=0}^{11} k_i \cdot z^{-1} \qquad (1)$$

using a transversal filter operating at 54 MHz, with the number of taps being 12.

From the data $\{Y_i\}$, with the clock rate of 54 MHz, as shown at D in FIGS. 1 and 2, every three data of i=3n, i=3n+1 or i =3n+2 is extracted at the clock rate of 13.5 MHz as shown at E in FIG. 1, whereby output data $\{Y_n\}$ with the clock rate of 13.5 MHz, in which frequency characteristics of the input data $\{X_m\}$ are maintained to the maximum extent, is obtained, as shown at E in FIG. 2.

With the 3:4-up rate converter, the input data $\{X_n\}$ with the clock rate of 13.5 MHz is converted into output data $\{Y_m\}$ with the clock rate of 18 MHz by the filtering shown in FIGS. 3 and 4.

That is, with the 3:4-up rate converter, zero data is inserted at the positions of 13.5 MHz clock rate input data $\{X_m\}$ shown at A in FIG. 3 which can become sampling points for 18 MHz as shown at B in FIG. 3, for upconverting the input data to the clock rate of a frequency equal to the least common multiple of 18 MHz and 13.5 MHz, that is 54 MHz. Thus, in the frequency domain, the frequency components repeated on the basis of 13.5 MHz as shown at A in FIG. 4 are now repeated at the unit of repetition of 54 MHz, with the frequency characteristics remaining unchanged, as shown at B in FIG. 4.

The data having the clock rate of 54 MHz is then passed through a filter having characteristics shown at C in FIGS. 3, 4. That is, since the output clock rate is 18 MHz, should there be frequency components of not less than 9 MHz (one-half of 18 MHz) up to 27 MHz (one-half of 54 MHz), aliasing is produced when the clock rate is set to 18 MHz, and hence original frequency characteristics cannot be maintained. Consequently, the data is passed through a low-pass filter for suppressing frequency components not less than 9 MHz.

The data $\{Y_i\}$ at the clock rate of 54 MHz, having frequency components not less than 9 MHz suppressed, is obtained as data $Y_1$ to $Y_{14}$, that is, $$Y_1 = k_3 \cdot X_3 + k_7 \cdot X_2 + k_{11} \cdot X_1$$

$$Y_2 = k_0 \cdot X_4 + k_4 \cdot X_3 + k_8 \cdot X_2$$

$$Y_3 = k_1 \cdot X_4 + k_5 \cdot X_3 + k_9 \cdot X_2$$

$$Y_4 = k_2 \cdot X_4 + k_6 \cdot X_3 + k_{10} \cdot X_2$$

$$Y_5 = k_3 \cdot X_4 + k_7 \cdot X_3 + k_{11} \cdot X_2$$

$$Y_6 = k_0 \cdot X_5 + k_4 \cdot X_4 + k_8 \cdot X_3$$

$$Y_7 = k_1 \cdot X_5 + k_5 \cdot X_4 + k_9 \cdot X_3$$

$$Y_8 = k_2 \cdot X_5 + k_6 \cdot X_4 + k_{10} \cdot X_3$$

$$Y_9 = k_3 \cdot X_5 + k_7 \cdot X_4 + k_{11} \cdot X_3$$

$$Y_{10} = k_0 \cdot X_6 + k_4 \cdot X_5 + k_8 \cdot X_4$$

$$Y_{11} = k_1 \cdot X_6 + k_3 \cdot X_5 + k_9 \cdot X_4$$

$$Y_{12} = k_2 \cdot X_6 + k_4 \cdot X_5 + k_{10} \cdot X_4$$

$$Y_{13} = k_3 \cdot X_6 + k_5 \cdot X_5 + k_{11} \cdot X_4$$

$$Y_{14} = k_0 \cdot X_7 + k_3 \cdot X_6 + k_8 \cdot X_5$$

by filtering input data $X_m = z^m \cdot X_1$ with a transfer function represented by the formula (2)

$$F_2(z) = \sum_{i=0}^{11} k_i \cdot z^{-1} \qquad (2)$$

using a transversal filter operating at 54 MHz, with the number of taps being 12.

From the data $\{Y_i\}$, with the clock rate of 54 MHz, as shown at D in FIGS. 3 and 4, every four data of i=4m−2, i=4m−1 i=4m or i=4m−3 is taken out at the clock rate of 18 MHz as shown at E in FIG. 3, so that output data $\{X_n\}$ with the clock rate of 18 MHz, in which frequency characteristics of the input data $\{X_m\}$ are maintained to the maximum extent, is obtained, as shown at E in FIG. 4.

With a M:N (M>N), such as 5:3, down rate converter, in which rate conversion of 5:3 is executed for converting $f_{SH}$ rate input data $\{X_m\}$ into $f_{SL}$ rate output data $\{Y_n\}$, every two "0"s are inserted between respective data of the $f_{SH}$ rate input data $\{X_m\}$ in order to generate 3 $f_{SH}$ rate data $\{Y_i\}$ which is filtered by a transversal filter operating at the 3 $f_{SH}$ rate. Every five data is sampled from the 3 $f_{SH}$ rate data $\{Y_i\}$ to generate data $\{Y_n\}$ having the rate of $f_{SL}$ ($F_{SL}$=3/5 $f_{SH}$).

That is, by inserting two "0"s as shown at B in FIG. 5 between data of the $f_{SH}$ rate input data as shown at A in FIG. 5 for up-conversion to the 3 $f_{SH}$ rate and by subsequently passing the up-converted data by a transversal filter operating at the 3 $f_{SH}$ rate by convolution by the coefficients shown at C in FIG. 5, data $Y_1$ to $Y_{16}$ $$Y_1 = k_0 \cdot X_1 + k_3 \cdot X_2 + k_6 \cdot X_3 + k_9 \cdot X_4 + k_{12} \cdot X_5$$

$$Y_2 = k_2 \cdot X_2 + k_5 \cdot X_3 + k_8 \cdot X_4 + k_{11} \cdot X_5 + k_{14} \cdot X_6$$

$$Y_3 = k_1 \cdot X_2 + k_4 \cdot X_3 + k_7 \cdot X_4 + k_{10} \cdot X_5 + k_{13} \cdot X_6$$

$$Y_4 = k_0 \cdot X_2 + k_3 \cdot X_3 + k_6 \cdot X_4 + k_9 \cdot X_5 + k_{12} \cdot X_6$$

$$Y_5 = k_2 \cdot X_3 + k_5 \cdot X_4 + k_8 \cdot X_5 + k_{11} \cdot X_6 + k_{14} \cdot X_7$$

$$Y_6 = k_1 \cdot X_3 + k_4 \cdot X_4 + k_7 \cdot X_5 + k_{10} \cdot X_6 + k_{13} \cdot X_7$$

-continued $$Y_7 = k_0 \cdot X_3 + k_3 \cdot X_4 + k_6 \cdot X_5 + k_9 \cdot X_6 + k_{12} \cdot X_7$$

$$Y_8 = k_2 \cdot X_4 + k_5 \cdot X_5 + k_8 \cdot X_6 + k_{11} \cdot X_7 + k_{14} \cdot X_8$$

$$Y_9 = k_1 \cdot X_4 + k_4 \cdot X_5 + k_7 \cdot X_6 + k_{10} \cdot X_7 + k_{13} \cdot X_8$$

$$Y_{10} = k_0 \cdot X_4 + k_3 \cdot X_5 + k_6 \cdot X_6 + k_9 \cdot X_7 + k_{12} \cdot X_8$$

$$Y_{11} = k_2 \cdot X_5 + k_5 \cdot X_6 + k_8 \cdot X_7 + k_{11} \cdot X_8 + k_{14} \cdot X_9$$

$$Y_{12} = k_1 \cdot X_5 + k_4 \cdot X_6 + k_7 \cdot X_7 + k_{10} \cdot X_8 + k_{13} \cdot X_9$$

$$Y_{13} = k_0 \cdot X_5 + k_3 \cdot X_6 + k_6 \cdot X_7 + k_9 \cdot X_8 + k_{12} \cdot X_9$$

$$Y_{14} = k_2 \cdot X_6 + k_5 \cdot X_7 + k_8 \cdot X_8 + k_{11} \cdot X_9 + k_{14} \cdot X_{10}$$

$$Y_{15} = k_1 \cdot X_6 + k_4 \cdot X_7 + k_7 \cdot X_8 + k_{10} \cdot X_9 + k_{13} \cdot X_{10}$$

$$Y_{16} = k_0 \cdot X_6 + k_3 \cdot X_7 + k_6 \cdot X_8 + k_9 \cdot X_9 + k_{12} \cdot X_{10}$$

are generated.

From the data $\{Y_i\}$, with the rate of 3 $f_{SH}$, as shown at D in FIG. 5, every five data of i=5n−4, i=5n−3 i=5n−2, i=5n−1 or i=5n, output data $\{Y_n\}$ having the rate of $f_{SL}$, is obtained, as shown at E in FIG. 5.

With a M:N (M<N), such as 3:5, up rate converter, in which rate conversion of 3:5 is executed for converting $f_{SL}$ rate input data $\{X_m\}$ into $f_{SH}$ rate output data $\{Y_n\}$, every four "0"s are inserted between the $f_{SL}$ rate input data $\{X_m\}$ in order to generate 5 $f_{SL}$ rate data $\{Y_{5n}\}$ which is filtered by a transversal filter operating at the 5 $f_{SL}$ rate. Every three data is sampled from the 5 $f_{SL}$ rate data $\{Y_{5n}\}$ to generate data $\{Y_n\}$ having the rate of $f_{SH}$ ($F_{SH}$=5/3 $f_{SL}$).

That is, by inserting four "0"s as shown at B in FIG. 6 between data of the $f_{SL}$ rate input data as shown at A in FIG. 6 for up-conversion to the 5 $f_{SL}$ rate and by subsequently passing the up-converted data by a transversal filter operating at the 5 $f_{SL}$ rate by convolution by the coefficients shown at C in FIG. 6, data $Y_1$ to $Y_{19}$ $$Y_1 = k_0 \cdot X_1 + k_5 \cdot X_2 + k_{10} \cdot X_3$$

$$Y_2 = k_4 \cdot X_2 + k_9 \cdot X_3 + k_{14} \cdot X_4$$

$$Y_3 = k_3 \cdot X_2 + k_8 \cdot X_3 + k_{13} \cdot X_4$$

$$Y_4 = k_2 \cdot X_2 + k_7 \cdot X_3 + k_{12} \cdot X_4$$

$$Y_5 = k_1 \cdot X_2 + k_6 \cdot X_3 + k_{11} \cdot X_4$$

$$Y_6 = k_0 \cdot X_2 + k_5 \cdot X_3 + k_{10} \cdot X_4$$

$$Y_7 = k_4 \cdot X_3 + k_9 \cdot X_4 + k_{14} \cdot X_5$$

$$Y_8 = k_3 \cdot X_3 + k_8 \cdot X_4 + k_{13} \cdot X_5$$

$$Y_9 = k_2 \cdot X_3 + k_7 \cdot X_4 + k_{12} \cdot X_5$$

$$Y_{10} = k_1 \cdot X_3 + k_6 \cdot X_4 + k_{11} \cdot X_5$$

$$Y_{11} = k_0 \cdot X_3 + k_5 \cdot X_4 + k_{10} \cdot X_5$$

$$Y_{12} = k_4 \cdot X_4 + k_9 \cdot X_5 + k_{14} \cdot X_6$$

$$Y_{13} = k_3 \cdot X_4 + k_8 \cdot X_5 + k_{13} \cdot X_6$$

$$Y_{14} = k_2 \cdot X_4 + k_7 \cdot X_6 + k_{12} \cdot X_6$$

$$Y_{15} = k_1 \cdot X_4 + k_6 \cdot X_6 + k_{11} \cdot X_6$$

$$Y_{16} = k_0 \cdot X_4 + k_5 \cdot X_6 + k_{10} \cdot X_6$$

$$Y_{17} = k_4 \cdot X_5 + k_9 \cdot X_6 + k_{14} \cdot X_7$$

$$Y_{18} = k_3 \cdot X_5 + k_8 \cdot X_6 + k_{13} \cdot X_7$$

$$Y_{19} = k_2 \cdot X_5 + k_7 \cdot X_6 + k_{12} \cdot X_7$$

are generated.

From the data $\{Y_i\}$, with the rate of 5 $f_{S1}$, as shown at D in FIG. 6, every three data of i=3n−2, i=3n−13 or i=3n is extracted, whereby output data $\{Y_m\}$ having the rate of $f_{SH}$, is obtained, as shown at E in FIG. 6.

With the camera built-in type DVTR having an imager operating at a clock rate of 18 MHz and a DVTR pursuant to the D1 standard operating at the clock rate of 13.5 MHz, integrated thereto, or a so-called digital camcorder, it is necessary to have both the above-mentioned down rate converter and the up rate converter, resulting in a large-sized circuit arrangement because of these rate converters.

On the other hand, with the conventional rate converter, it is necessary to have a fast arithmetic-logical unit for executing filtering at a clock rate equal to the least common multiple of the input and output clock rates.

With the 4:3 down rate converter for converting the 18 MHz clock rate input data $\{Y_m\}$ into 13.5 MHz clock rate output data $\{Y_n\}$, the data $\{Y_i\}$ having the clock rate of 54 MHz, which is the least common multiple of the 13.5 MHz input clock rate and the 18 MHz output clock rate, obtained by the filtering by the transfer function $F_1(z)$ shown by the formula (1), can be classed into the following three groups, depending on coefficients:

The first group is made up of $i=3n-1$ data $\{Y_{(3n-1)}\}$ having coefficients $\{k_0, k_3, k_6, k_9\}$, such that $$Y_2 = k_0 \cdot X_5 + k_3 \cdot X_4 + k_6 \cdot X_3 + k_9 \cdot X_2$$
$$Y_5 = k_0 \cdot X_6 + k_3 \cdot X_5 + k_6 \cdot X_4 + k_9 \cdot X_3$$
$$Y_8 = k_0 \cdot X_7 + k_3 \cdot X_6 + k_6 \cdot X_5 + k_9 \cdot X_4$$
$$Y_{11} = k_0 \cdot X_8 + k_3 \cdot X_7 + k_6 \cdot X_6 + k_9 \cdot X_5$$
$$Y_{14} = k_0 \cdot X_9 + k_3 \cdot X_8 + k_6 \cdot X_7 + k_9 \cdot X_6$$

The second group is made up of $i=3n$ data $\{Y_{(3n)}\}$ having coefficients $\{k_1, k_4, k_7, k_{10}\}$, such that $$Y_3 = k_1 \cdot X_5 + k_4 \cdot X_4 + k_7 \cdot X_3 + k_{10} \cdot X_2$$
$$Y_6 = k_1 \cdot X_6 + k_4 \cdot X_5 + k_7 \cdot X_4 + k_{10} \cdot X_3$$
$$Y_9 = k_1 \cdot X_7 + k_4 \cdot X_6 + k_7 \cdot X_5 + k_{10} \cdot X_4$$
$$Y_{12} = k_1 \cdot X_8 + k_4 \cdot X_7 + k_7 \cdot X_6 + k_{10} \cdot X_5$$

The third group is made up of $i=3n-2$ data $\{Y_{(3n-2)}\}$ having coefficients $\{k_2, k_5, k_8, k_{11}\}$, such that $$Y_1 = k_2 \cdot X_4 + k_5 \cdot X_3 + k_8 \cdot X_2 + k_{11} \cdot X_1$$
$$Y_4 = k_2 \cdot X_5 + k_5 \cdot X_4 + k_8 \cdot X_3 + k_{11} \cdot X_2$$
$$Y_7 = k_2 \cdot X_6 + k_5 \cdot X_5 + k_8 \cdot X_4 + k_{11} \cdot X_3$$
$$Y_{10} = k_2 \cdot X_7 + k_5 \cdot X_6 + k_8 \cdot X_5 + k_{11} \cdot X_4$$
$$Y_{13} = k_2 \cdot X_8 + k_5 \cdot X_7 + k_8 \cdot X_6 + k_{11} \cdot X_5$$

The data $\{Y_{(3n-1)}\}$ having the group of coefficients $\{k_0, k_3, k_6, k_9\}$ may be obtained using a transversal filter of the transfer function $Fa(z)$, that is $$Fa(z)=k_0+k_3 \cdot z^{-1}+k_6 \cdot z^{-2}+k_9 \cdot z^{-3}$$

The data $\{Y_{(3n)}\}$ having the group of coefficients $\{k_1, k_4, k_7, k_{10}\}$ may be obtained using a transversal filter of the transfer function $Fb(z)$, that is $$Fb(z)=k_1+k_4 \cdot z^{-1}+k_7 \cdot z^{-2}+k_{10} \cdot z^{-3}$$

In addition, the data $\{Y_{(3n-2)}\}$ having the group of coefficients $\{k_2, k_5, k_8, k_{11}\}$ may be obtained using a transversal filter of the transfer function $Fc(z)$, that is $$Fc(z)=k_2+k_5 \cdot z^{-1}+k_8 \cdot z^{-2}+k_{11} \cdot z^{-3}$$

Consequently, with the 4:3 down rate converter, the output data $\{Y_n\}$ may be calculated by parallel operation of three transversal filters performing the filtering with the transfer functions $Fa(z)$, $Fb(z)$ and $Fc(z)$ at the input clock rate of 18 Mhz, in place of upconverting the input data of 18 Mhz clock rate $\{X_m\}$ to the clock rate of 54 MHz (the least common multiple) by inserting zero data.

Similarly, with the up rate converter of converting the input data with the 13.5 MHz clock rate $\{X_n\}$ into output data $\{Y_m\}$ with the 18 MHz clock rate, the data $\{Y_i\}$ with the clock rate of 54 MHz, corresponding to the least common multiple of the 18 MHz output clock rate and the 13.5 MHz clock rate resulting from filtering by the transfer function $F_2(z)$ shown by the formula (2), may be classed into four groups, namely $i=4m-2$ data $\{Y_{(4m-2)}\}$ having a first group of coefficients $\{k_0, k_4, k_8\}$, $i=4m-1$ data $\{Y_{(4m-1)}\}$ having a second group of coefficients $\{k_1, k_5, k_9\}$, $i=4m$ data $\{Y_{(4m)}\}$ having a third group of coefficients $\{k_2, k_6, k_{10}\}$ and $i=4m-3$ data $\{Y_{(4m-3)}\}$ having a fourth group of coefficients $\{k_3, k_7, k_{11}\}$. Thus the output data $\{Y_m\}$ may be calculated by parallel operation of four transversal filters performing the filtering with the transfer functions $$Fa(z)=k_0+k_4 \cdot z^{-1}+k_8 \cdot z^{-2}$$
$$Fb(z)=k_1+k_5 \cdot z^{-1}+k_9 \cdot z^{-2}$$
$$Fc(z)=k_2+k_6 \cdot z^{-1}+k_{10} \cdot z^{-2}$$
$$Fd(z)=k_3+k_7 \cdot z^{-1}+k_{11} \cdot z^{-2}$$

at the input clock rate of 13.5 MHz, in place of upconverting the input data of 13.5 MHz clock rate $\{X_n\}$ to the clock rate of 54 MHz (the least common multiple) by inserting zero data.

By such parallel operation of the plural transversal filters at an input clock rate, the necessity of providing a fast transversal filter operated at the clock rate equal to the least common multiple of the input and output clock rates is eliminated. However, plural transversal filters become necessary.

Up to now, a register pre-fix type transversal filter and a register post-fix type transversal filter have been known.

With the register pre-fix type transversal filter, as shown in FIG. 7, a time difference of a unit time $\{z^{-1}\}$ corresponding to one clock is applied to the input data $\{X_n\}$ by delay circuits 1A, 2A and 1C. The delayed data is then multiplied by the filter coefficients $\{k_1, k_2, k_3 \text{ and } k_4\}$ by multipliers 2A, 2B, 2C and 2D, and the resulting products are summed by an additive unit 3 to generate output data Y such that $$Y=k_1 \cdot X_4+k_2(z^{-1} \cdot X_3)+k_3(z^{-2} \cdot X_2)+k_4(z^{-3} \cdot X_1)$$

For a rate converter, a register-prefix type transversal filter has been in use. However, such register-prefix type transversal filter is in need of a multi-input additive unit as the additive unit 3. In addition, a hold time need be provided for the shift register. Thus the register-prefix type filter is unfit for fast operation.

On the other hand, with the register-postfix type transversal filter, as shown in FIG. 8, the input data $\{X_n\}$ is multiplied with filter coefficients $\{k_1, k_2, k_3 \text{ and } k_4\}$, by multipliers 4A, 4B, 4C and 4D, and a time difference of a unit time $\{z^{-1}\}$ is applied to the resulting products. The delayed products are then summed by additive units 6A, 6B and 6C to generate output data Y such that $$Y = k_1 \cdot X_4 + (k_2 \cdot X_3)z^{-1} + (k_3 \cdot X_2)z^{-2} + (k_4 \cdot X_1)z^{-3}$$

With the register post-fix type transversal filter, the delay circuit constituting a shift register is simultaneously used as a pipeline register. Besides, since the additive units are connected between the delay circuits, there is no necessity of providing the hold time. Thus it is of an efficient circuit configuration for fast operation with the aid of a fast process. However, since zero is inserted in the input data in the up rate conversion, a data hold operation becomes necessary during filtering. However, such data holding operation cannot be performed with the register postfix type transversal filter because there is no register ahead of each multiplier.

It is therefore an object of the present invention to provide the rate converter and the imager constructed in the following manner.

Thus it is an object of the present invention to provide a rate converter in which rate conversion may be achieved by a sole transversal filter without necessitating a fast transversal filter operated at a clock rate equal to the least common multiple of the input and output clock rates.

It is another object of the present invention to provide a bidirectional rate converter having the functions of both the down rate converter and the up rate converter.

It is another object of the present invention to provide a bidirectional rate converter in which the circuit scale is diminished by using a common filtering means for the down rate converter and the up rate converter.

It is also an object of the present invention to provide an imager which may be reduced in size.

DISCLOSURE OF THE INVENTION

As discussed above, the principle of the rate converter resides in that, by up converting input data to a clock rate equal to the least common multiple of the input clock rate and the output clock rate and thinning the up converted data by a filter, output data of desired output clock rate can be produced. Since there is no necessity of calculating data other than the output data of the desired clock rate, rate conversion may be achieved by a sole-transversal filter operating at the output clock rate without requiring a fast transversal filter operating at the clock rate equal to the least common multiple of the input and output clock rates, if the filtering is performed at the output clock rate for producing the output clock rate output data.

For example, in a 4:3 down rate converter for converting 18 MHz clock rate input data $\{X_m\}$ into 13.5 MHz clock rate $\{Y_n\}$ output data, output data are the data taken out at the clock rate of 13.5 MHz, that is $\{Y_{(4m)}\}$, $\{Y_{(4m+1)}\}$, $\{Y_{(4m+2)}\}$ or $\{Y_{(4m+3)}\}$, from the data $\{Y_i\}$ having the clock rate of 54 MHz equal to the least common multiple of the input and output clock rates, produced by up converting the 10 MHz clock rate input data. For example, if $\{Y_{(4n)}\}$ is the output data, such that $$Y_0 = k_1 \cdot X_4 + k_4 \cdot X_3 + k_7 \cdot X_2 + k_{10} \cdot X_1$$

$$Y_4 = k_2 \cdot X_5 + k_5 \cdot X_4 + k_8 \cdot X_3 + k_{11} \cdot X_2$$

$$Y_8 = k_0 \cdot X_7 + k_3 \cdot X_6 + k_6 \cdot X_5 + k_9 \cdot X_4$$

$$Y_{12} = k_1 \cdot X_8 + k_4 \cdot X_7 + k_7 \cdot X_6 + k_{10} \cdot X_5$$

$$Y_{16} = k_2 \cdot X_9 + k_5 \cdot X_8 + k_8 \cdot X_7 + k_{11} \cdot X_6$$

$$Y_{20} = k_0 \cdot X_{11} + k_3 \cdot X_{10} + k_6 \cdot X_9 + k_9 \cdot X_8$$

it suffices to sequentially select outputs of three transversal filters performing the filtering of the transfer functions Fa(z), Fb(z) and Fc(z) with the above-mentioned first to third sets of coefficients. That is, the output data $\{Y_n\}$ can be produced by operating a sole transversal filter, with the first to third coefficients being sequentially switched at the output clock rate of 13.5 MHz, with the input data $\{X_m\}$ being latched at the input clock rate of 18 MHz.

Similarly, in a 3:4 up rate converter for converting 13.5 MHz clock rate input data $\{X_n\}$ into 18 MHz clock rate $\{Y_m\}$ output data, output data are data taken out at the clock rate of 18 MHz, that is $\{Y_{(3n)}\}$, $\{Y_{(3n+1)}\}$, $\{Y_{(3n+2)}\}$, $\{Y_{(3n+3)}\}$, so that, if $\{Y_{(3n+1)}\}$ is the output data, $$Y_1 = k_3 \cdot X_3 + k_7 \cdot X_2 + k_{11} \cdot X_1$$

$$Y_4 = k_2 \cdot X_4 + k_6 \cdot X_3 + k_{10} \cdot X_2$$

$$Y_7 = k_1 \cdot X_5 + k_5 \cdot X_4 + k_9 \cdot X_3$$

$$Y_{10} = k_0 \cdot X_6 + k_4 \cdot X_5 + k_8 \cdot X_4$$

$$Y_{13} = k_3 \cdot X_6 + k_7 \cdot X_5 + k_{11} \cdot X_4$$

$$Y_{16} = k_2 \cdot X_7 + k_6 \cdot X_6 + k_{10} \cdot X_5$$

$$Y_{19} = k_1 \cdot X_8 + k_5 \cdot X_7 + k_9 \cdot X_6$$

$$Y_{22} = k_0 \cdot X_9 + k_4 \cdot X_8 + k_8 \cdot X_7$$

$$Y_{25} = k_3 \cdot X_9 + k_7 \cdot X_8 + k_{11} \cdot X_7$$

$$Y_{28} = k_2 \cdot X_{10} + k_6 \cdot X_9 + k_{10} \cdot X_8$$

so that it suffices to sequentially select outputs of four transversal filters performing the filtering of the transfer functions Fa(z), Fb(z), Fc(z) and Fd(z) with the above-mentioned first to fourth sets of coefficients. That is, the output data $\{Y_m\}$ can be obtained by operating a sole transversal filter, with the first to fourth coefficients being sequentially switched at the output clock rate of 18 MHz, with the input data $\{X_n\}$ being latched at the input clock rate of 13.5 MHz.

Thus, in accordance with the present invention, $f_{SH}$ rate data are generated by inserting M−N O data for every N data of $f_{SL}$ data input data by interpolation, and the $f_{SH}$ rate data is filtered by a register postfix type transversal filter having M multipliers sequentially fed with filter coefficients at the $f_{SH}$ rate from M coefficient generators, in order to perform up rate conversion of N:M (N<M). It is possible with the present rate converter to achieve N:N+1 up rate conversion by setting so that M−N=1. It is also possible with the present rate converter to achieve N:N+2 up rate conversion by setting so that M−N=2. Consequently, with the present rate converter, up rate conversion of N:M (N<M) may be achieved by a register postfix type transversal filter without requiring a fast transversal filter operating at a clock rate equal to the least common multiple of the input and output clock rates, whereby fan output data may be generated from $f_{SL}$ input data.

Also, with the present invention, $f_{SH}$ rate input data is filtered by a register postfix type transversal filter having M multipliers sequentially fed with filter coefficients at a $f_{SH}$ rate, and output data of the transversal filter is thinned by a thinning circuit in order to effect down rate conversion of M:N (M>N) for producing $f_{SL}$ output data from the $f_{SH}$ rate input data. It is possible with the present rate converter to achieve N+1:N down rate conversion by setting so that M=N+1. It is also possible with the present rate converter to achieve N+2:N down rate conversion by setting so that M=N+2. Consequently, with the present rate converter, down rate conversion of N:M (M>N) may be achieved by a register postfix type transversal filter without requiring a fast transversal filter operating at a clock rate equal to the least common multiple of the input and output clock rates, whereby $F_{SL}$ output data may be generated from $f_{SH}$ input data.

Also, according to the present invention, the connection of the interpolation circuit for inserting M−N 0 data for every N data for generating $f_{SH}$ rate data from the $F_{SL}$ rate input data and the thinning circuit for thinning the $f_{SH}$ rate filter output of the transversal filter to the register postfix type transversal filter for filtering $f_{SH}$ rate data based upon filter coefficients sequentially applied at $f_{SH}$ rate from M coefficient generators is changed over by an input changeover circuit and an output changeover circuit in order to execute up rate conversion by N:M, where N<M, of generating $f_{SH}$ rate output data from the $F_{SL}$ rate input data and down rate conversion by M:N, where M>N, of generating $F_{SL}$ rate output data from the $f_{SH}$ rate input data. It is possible with the present rate converter to effectuate up rate conversion of N:N+1, where M=N+1, and down rate conversion of N+1:N, where M=N+1. It is also possible with the present rate converter to effectuate down rate conversion of N+2:N, where M=N+2. Consequently, with the present rate converter, bidirectional rate conversion of up rate conversion of N:M (N<M) of generating $f_{SH}$ rate output data from $F_{SL}$ rate input data and down rate conversion of M:N (M>N) of generating $F_{SL}$ rate output data from $f_{SH}$ rate input data may be achieved by a register postfix type transversal filter without requiring a fast transversal filter operating at a clock rate equal to the least common multiple of the input and output clock rates. Thus, with the present invention, filtering means may be used in common by the down rate converter and the up rate converter for providing a bidirectional rate converter having a reduced circuit scale.

With an imager according to the present invention, $F_{SL}$ rate second digital video signals are generated from $f_{SH}$ rate first digital signals produced by the imaging means during the recording mode by the bidirectional rate converter according to the present invention. During the reproducing mode, $f_{SH}$ rate first digital video signals are generated from $F_{SL}$ rate second digital video signals obtained by the recording/reproducing means by up rate conversion of m:N where M>N. This enables the imager to be reduced in size.

BRIEF DESCRIPTION OF THE DRAWINGS

FIG. 5 shows the operating principle of a conventional 5:3 down rate converter on the time axis.

FIG. 6 shows the operating principle of a conventional 3:5 up rate converter on the time axis.

BEST MODE FOR CARRYING OUT THE INVENTION

Figure 1A:
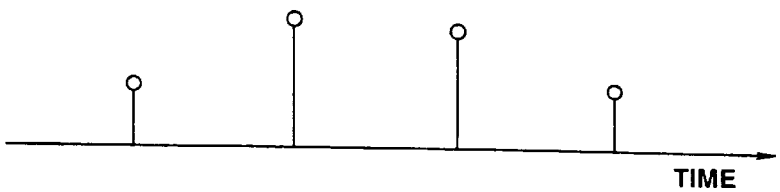
FIG. 1 shows the operating principle of a conventional 4:3 down rate converter on the time axis.
Figure 1B:
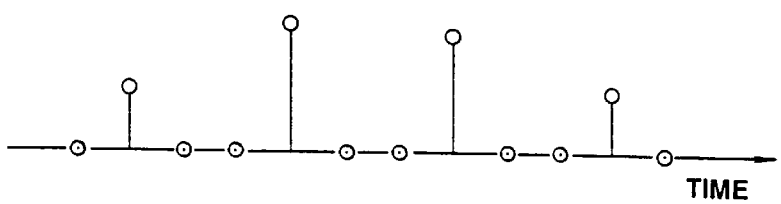
Figure 1C:
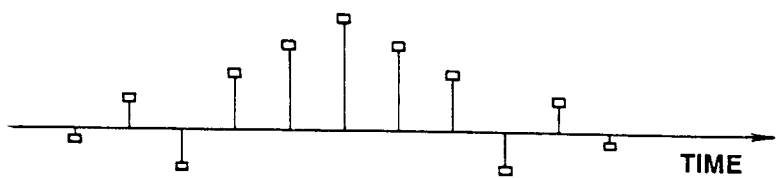
Figure 1D:
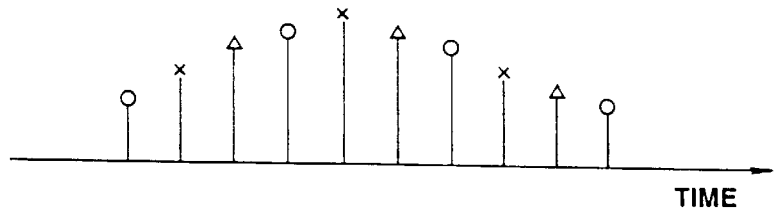
Figure 1E:
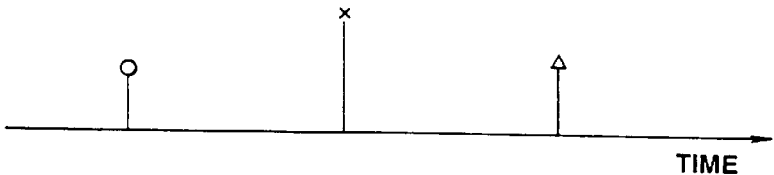
Figure 2A:
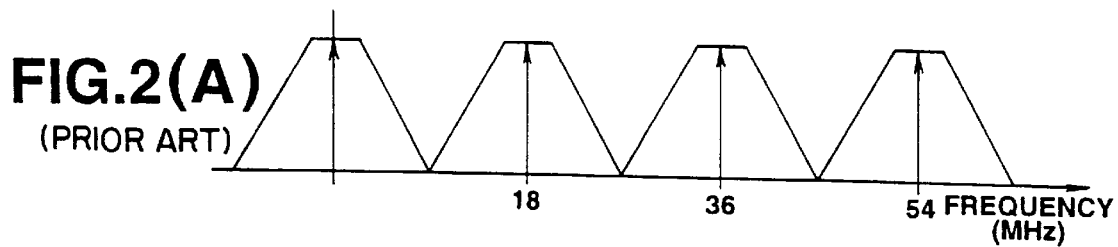
FIG. 2 shows the operating principle of the above 4:3 down rate converter on the frequency axis.
Figure 2B:
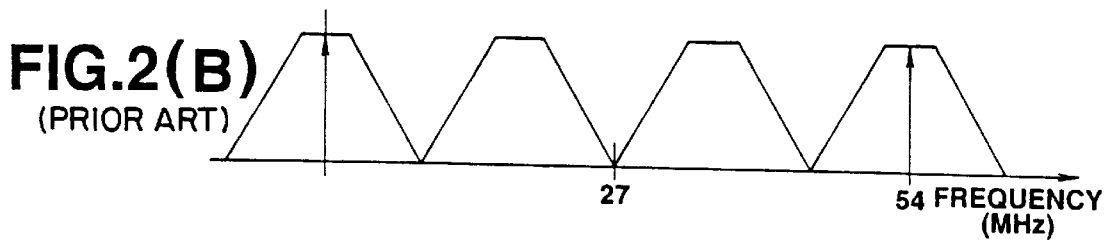
Figure 2C:
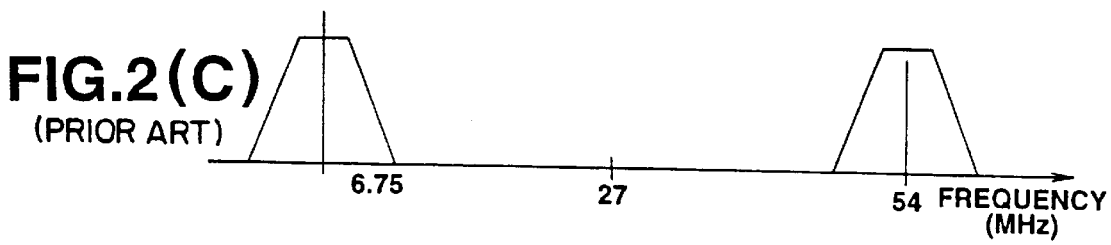
Figure 2D:
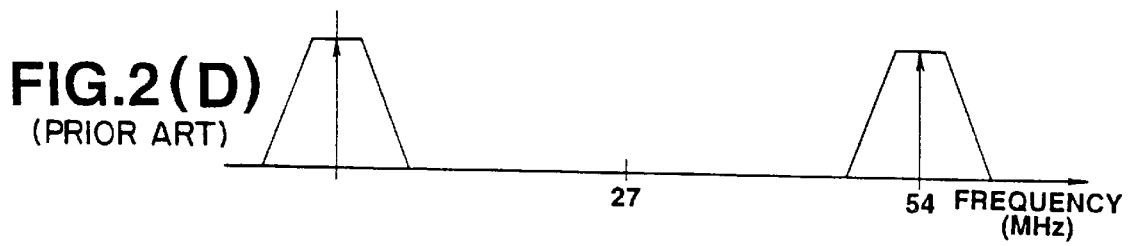
Figure 2E:
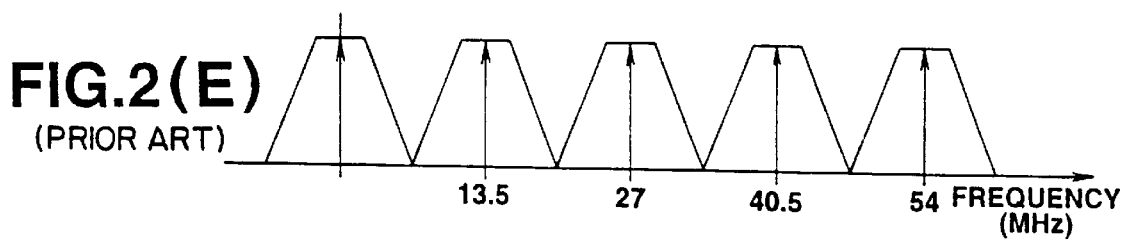
Figure 3A:
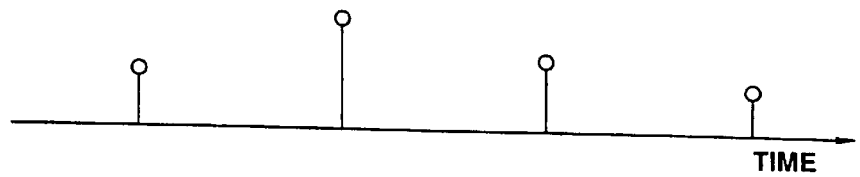
FIG. 3 shows the operating principle of a conventional 3:4 up rate converter on the time axis.
Figure 3B:
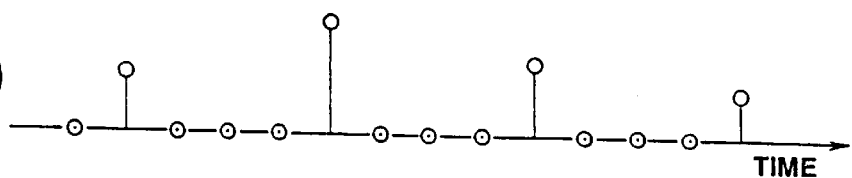
Figure 3C:
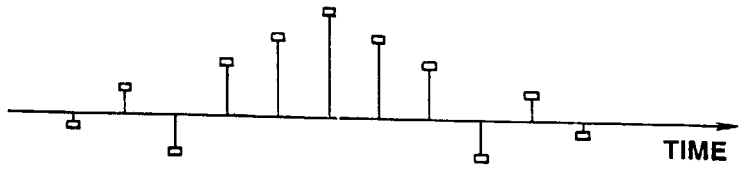
Figure 3D:
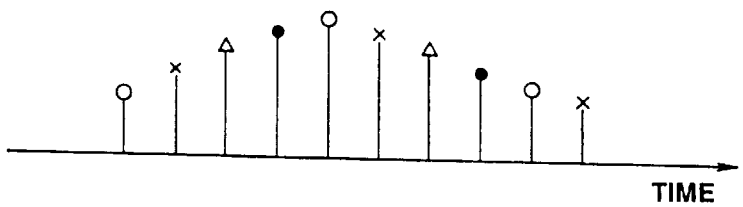
Figure 3E:
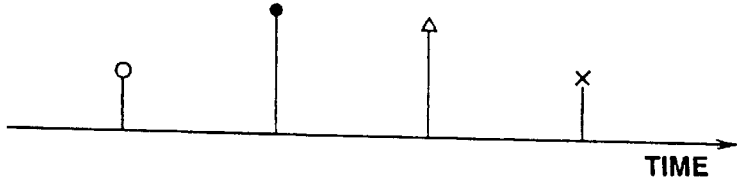
Figure 4A:
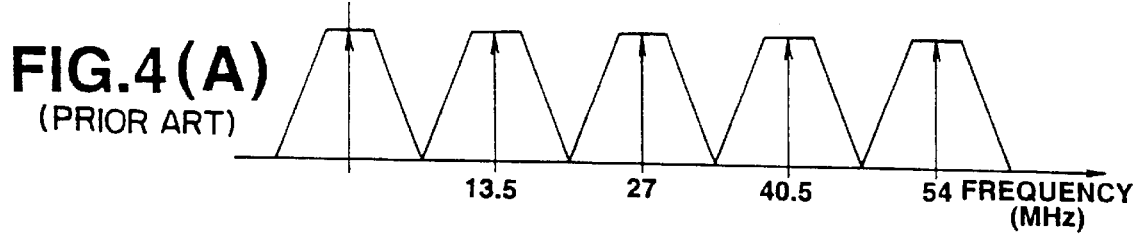
FIG. 4 shows the operating principle of a conventional 3:4 up rate converter on the frequency axis.
Figure 4B:
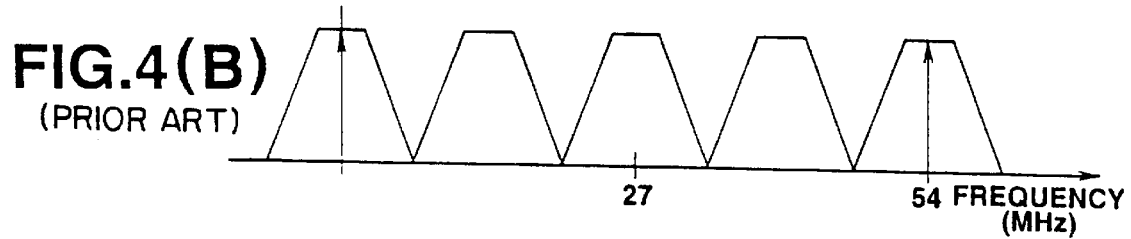
Figure 4C:
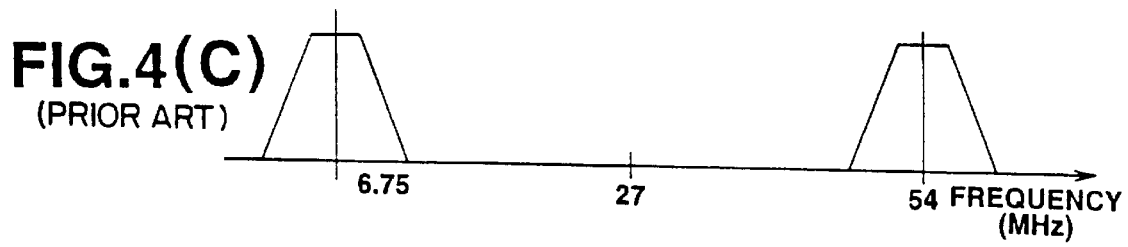
Figure 4D:
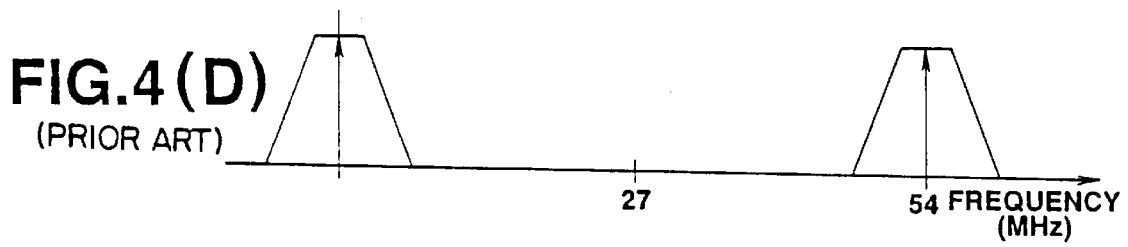
Figure 4E:
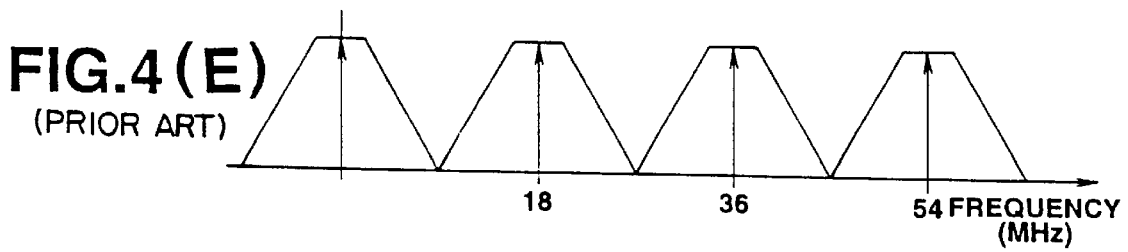
Figure 7:
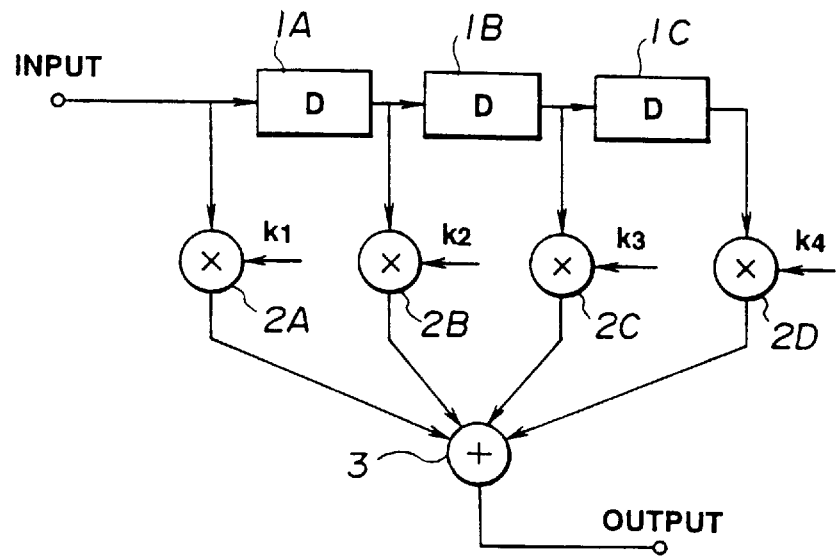
FIG. 7 is a block diagram showing an arrangement of a register prefix type transversal filter.
Figure 8:
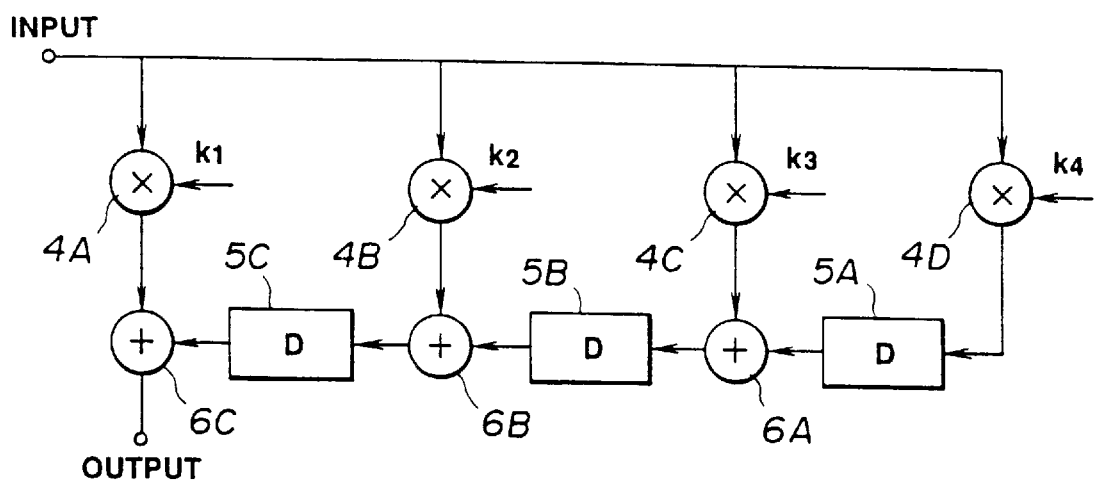
FIG. 8 is a block diagram showing an arrangement of a register postfix type transversal filter.

Referring to the drawings, a preferred embodiment of the present invention will be explained in detail.

Figure 9:
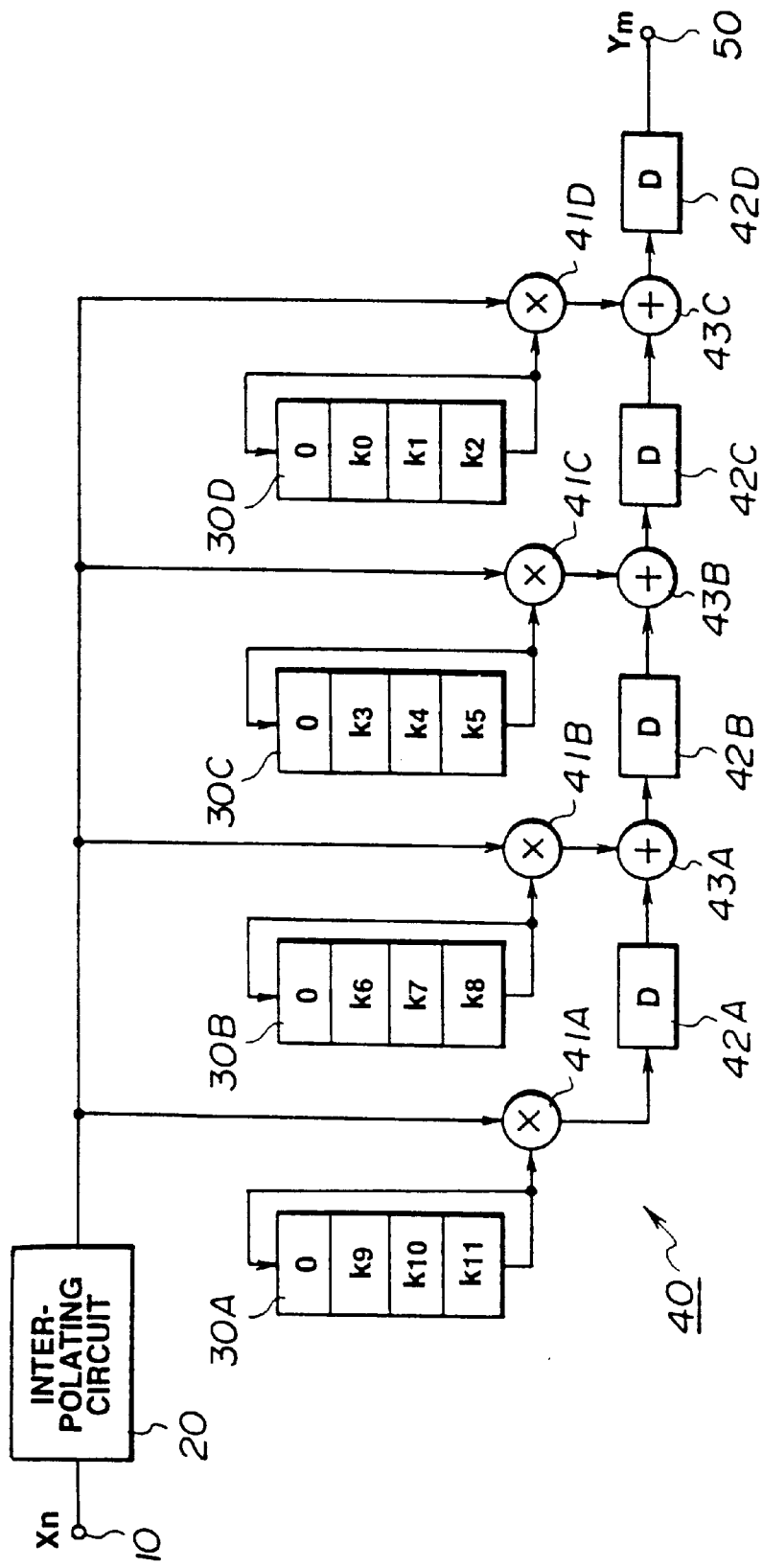
FIG. 9 is a block diagram showing an arrangement of a 3:4 up rate converter according to the present invention.

The rate converter according to the present invention is configured as shown for example in the block diagram of FIG. 9.

In the first embodiment, shown in FIG. 9, the present invention is applied to an up converter for executing 3:4 up rate conversion of converting input data $\{X_n\}$ having a rate of $F_{SL}$ ($f_{SL}$=13.5 MHz) into output data $\{Y_m\}$ having a rate of $f_{SH}$ ($f_{SH}$=18 MHz). The up rate converter comprises an interpolation circuit 20 for generating $f_{SH}$ rate by interpolation on input data $\{X_n\}$ of the $F_{SL}$ entered via an input terminal 10, four coefficient generators 30A, 30B, 30C and 30D for sequentially outputting filter coefficients and a transversal filter 40 for filtering $f_{SH}$ rate data generated by the interpolating circuit 20 based on the filter coefficients for outputting $f_{SH}$ rate output data $\{Y_m\}$ at an output terminal 50.

Figure 10:
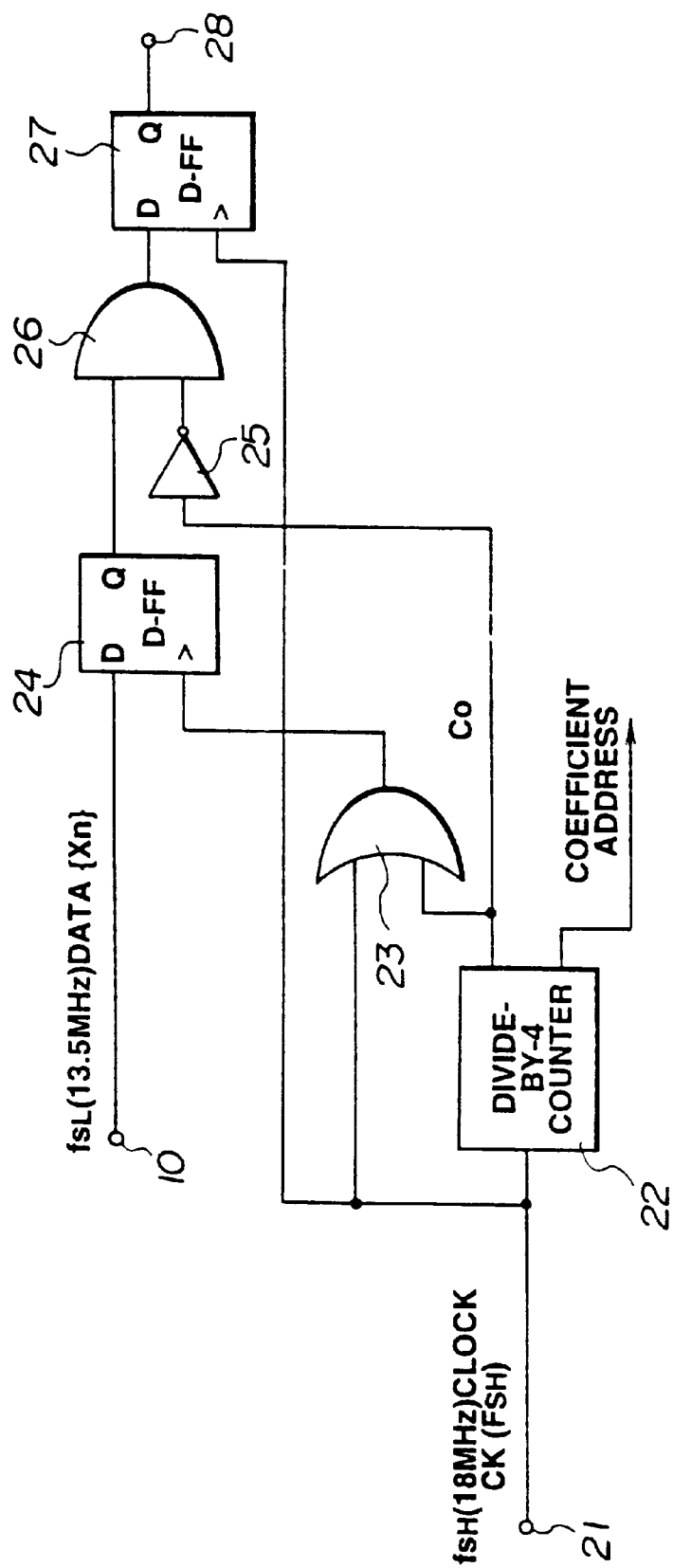
FIG. 10 is a block diagram showing a practical arrangement of an interpolating circuit in the above 3:4 up rate converter.

The interpolating circuit 20 generates $f_{SH}$ rate data by inserting one 0 data for every three data of the $f_{SL}$ rate input data $\{X_n\}$ supplied via the input terminal 10, and is configured as shown for example in the block diagram of FIG. 10.

The interpolating circuit 20 includes a divide-by-4 counter 22, for counting 18 MHz clocks CK($f_{SH}$) supplied thereto via the clock input terminal 21 and an OR gate 23 fed with a carry output of the divide-by-4 counter 22 and the above-mentioned clock CK($f_{SH}$). The interpolation circuit also includes a first D-flipflop 24 the data terminal of which is fed with input data $\{X_n\}$ of the $F_{SL}$ rate synchronized with the 13.5 MHz clock $CK(f_{SL})$ via the input terminal 10, an AND gate 26 fed with a latch output by the first D-flipflop 24 and with a carry Co from the divide-by-4 counter 22 via an inverter 25, and the second D-flipflop 27 the data input terminal of which is fed with a gate output data of the AND gate 26.

The divide-by-4 counter 22 outputs a carry Co at an interval of four clocks by counting 18 MHz clocks $CK(f_{SH})$ fed via the clock input terminal 21. The OR gate 23 ANDs the clock $CK(f_{SH})$ and the carry Co outputted from the divide-by-4 counter 22 in order to generate clocks d-CK having clock interruption at a rate of one of four clocks, as shown in FIG. 11.

The first D-flipflop 24 has its clock input terminal fed with the clock d-CK generated by the OR gate 23, and latches by the clock d-CK the $F_{SL}$ rate input data $\{X_n\}$ synchronized with the 13.5 MHz clocks $CK(f_{SH})$ supplied via the input terminal 10.

The AND circuit 26 ANDs the latched output data of the first D-flipflop 24 and the carry Co outputted by the divide-by-4 counter 22 and inverted by an inverter 25 in order to convert the inverted data by the inverter 25 into 0 data which is inserted into latch output data of the first D-flipflop 24.

Figure 11:
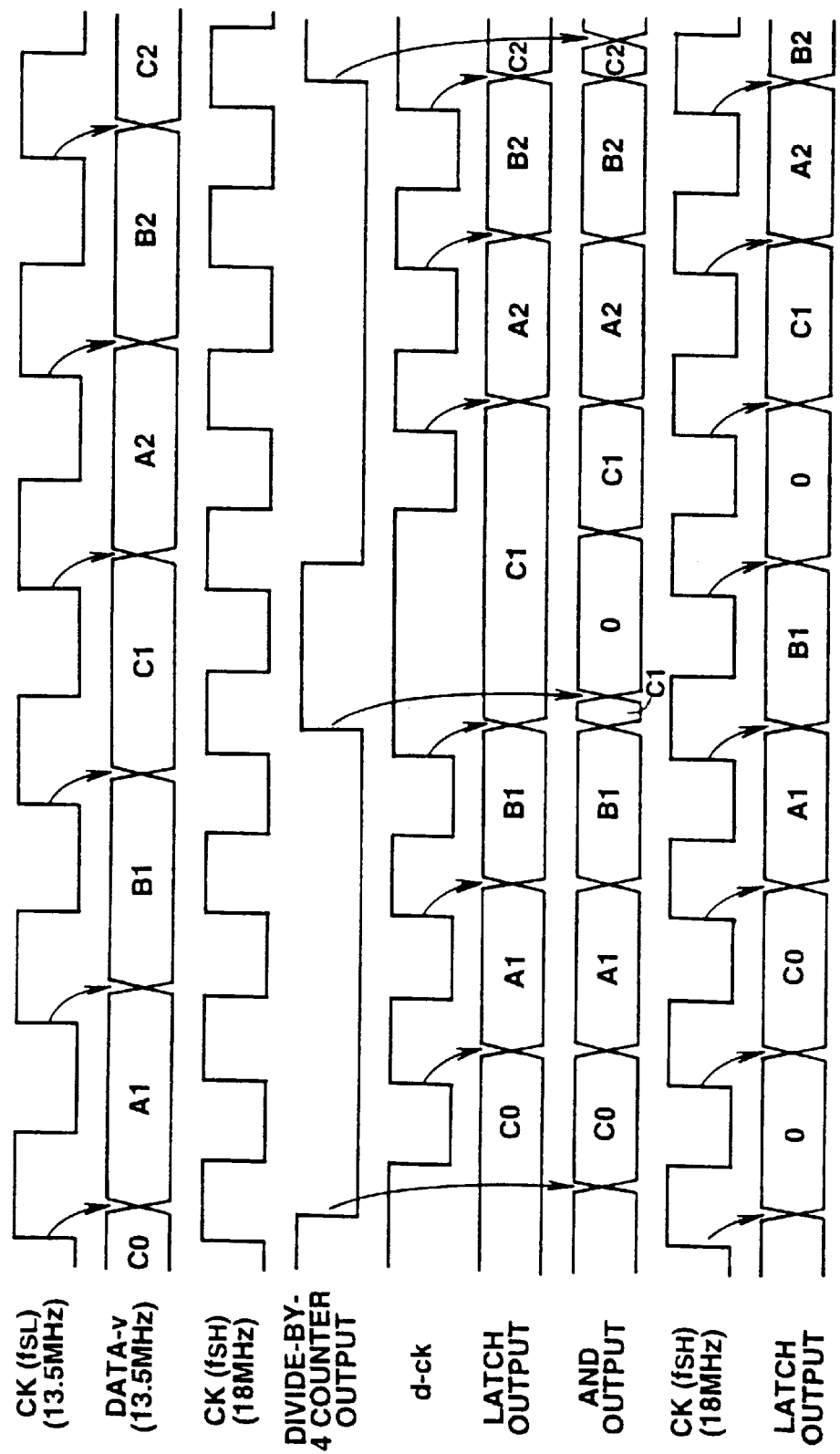
FIG. 11 is a timing chart showing the operation of the above interpolating circuit.

The second D-flipflop 27 latches the output data of the AND gate 26 by the 18 MHz clocks $CK(f_{SH})$ for generating $f_{SH}$ rate data in which 0 data is inserted at every three data of the $F_{SL}$ rate input data $\{X_n\}$ synchronized with the 13.5 MHz clocks $CK(f_{SL})$ as shown in FIG. 11.

The coefficient generators 30A, 30B, 30C, 30D sequentially output the filter coefficients at the $f_{SH}$. Of these, the first coefficient generator 30A repeatedly generates the filter coefficients $k_{11}$, $k_{10}$, $k_9$, 0 at the $f_{SH}$ rate. The second coefficient generator 30B repeatedly generates the filter coefficients $k_8$, $k_7$, $k_6$, 0 at the $f_{SH}$ rate, while the third coefficient generator 30C repeatedly generates the filter coefficients $k_5$, $k_4$, $k_3$, 0 at the $f_{SH}$ rate. The fourth coefficient generator 30D repeatedly generates the filter coefficients $k_2$, $k_1$, $k_0$, 0 at the $f_{SH}$ rate.

The transversal filter 40 processes the data of the $f_{SH}$ rate generated by the interpolating circuit 20 with rate-converting filtering based on the filter coefficients sequentially supplied by the four coefficient generators 30A, 30B, 30C, 30D.

This transversal filter 40 is a register postfix type or transposed type transversal filter made up of four multipliers 41A, 41B, 41C and 41D, four delay circuits 42A, 42B, 42C and 42D and three additive units 43A, 43B and 43C. The $f_{SH}$ rate data generated by the interpolating circuit 20 are supplied simultaneously to the four multipliers 41A, 41B, 41C and 41D.

Of the multipliers 41A, 41B, 41C and 41D, the first multiplier 41A is repeatedly supplied by the coefficient generator 30A with the filter coefficients $k_{11}$, $k_{10}$, $k_9$, 0 at the $f_{SH}$ rate, and multiplies the $f_{SH}$ rate data generated by the interpolating circuit 20 with the filter coefficients $k_{11}$, $k_{10}$, $k_9$, 0 at the $f_{SH}$ rate. The output product data of the first multiplier 41A is fed to the additive unit 43A via the first delay circuit 42A.

The second multiplier 41B is repeatedly supplied by the coefficient generator 30B with the filter coefficients $k_8$, $k_7$, $k_6$, 0 at the $f_{SH}$ rate, and multiplies the $f_{SH}$ rate data generated by the interpolating circuit 20 with the filter coefficients $k_8$, $k_7$, $k_6$, 0 at the $f_{SH}$ rate. The output product data of the second multiplier 41B is fed to the first additive unit 43A. The output sum data of the first additive unit 43A is fed via the second delay circuit 42B to the second additive unit 43B.

The third multiplier 41C is repeatedly supplied by the coefficient generator 30C with the filter coefficients $k_5$, $k_4$, $k_3$, 0 at the $f_{SH}$ rate, and multiplies the $f_{SH}$ rate data generated by the interpolating circuit 20 with the filter coefficients $k_5$, $k_4$, $k_3$, 0 at the $f_{SH}$ rate. The output product data of the second multiplier 41C is fed to the second additive unit 43B. The output sum data of the second additive unit 43B is fed via the third delay circuit 42C to the third additive unit 43C.

The fourth multiplier 41D is repeatedly supplied by the coefficient generator 30D with the filter coefficients $k_2$, $k_1$, $k_0$, 0 at the $f_{SH}$ rate, and multiplies the $f_{SH}$ rate data generated by the interpolating circuit 20 with the filter coefficients $k_2$, $k_1$, $k_0$, 0 at the $f_{SH}$ rate. The output product data of the fourth multiplier 41D is fed to the third additive unit 43C. The output sum data of the third additive unit 43C is fed via the fourth delay circuit 42D to the output terminal 50.

Figure 12:
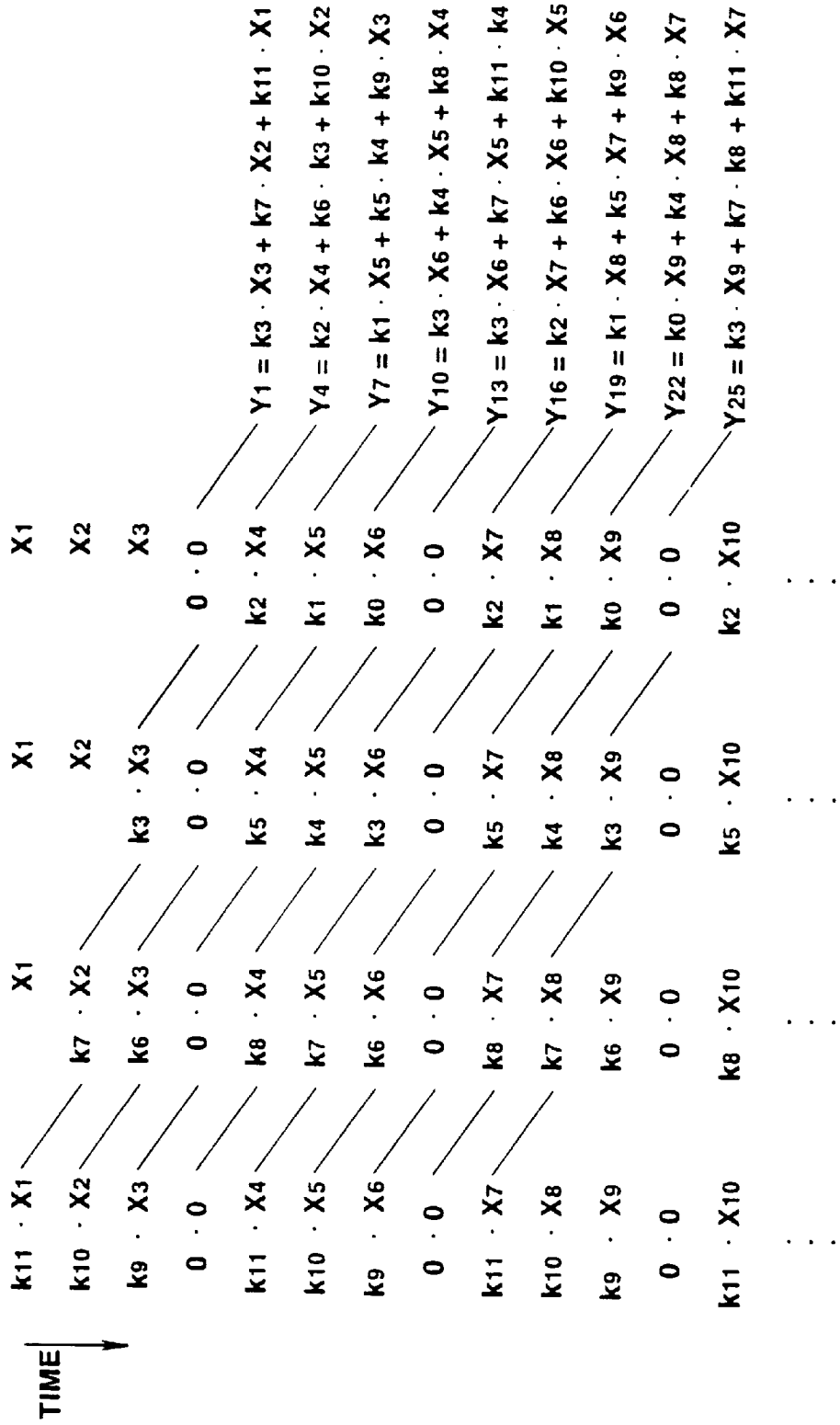
FIG. 12 shows the contents of the arithmetic-logical operations in the above 3:4 up rate converter.

In the above-described transversal filter 40, the arithmetic-logical operation shown i FIG. 12 is executed, so that i=3m+1 data, converted from the $F_{SL}$ input data $\{X_n\}$ into $f_{SH}$ rate data, that is $$Y_1 = k_3 \cdot X_3 + k_7 \cdot X_2 + k_{11} \cdot X_1$$

$$Y_4 = k_2 \cdot X_4 + k_6 \cdot X_3 + k_{10} \cdot X_2$$

$$Y_7 = k_1 \cdot X_5 + k_5 \cdot X_4 + k_9 \cdot X_3$$

$$Y_{10} = k_0 \cdot X_6 + k_4 \cdot X_5 + k_8 \cdot X_4$$

$$Y_{13} = k_3 \cdot X_6 + k_7 \cdot X_5 + k_{11} \cdot X_4$$

$$Y_{16} = k_2 \cdot X_7 + k_6 \cdot X_6 + k_{10} \cdot X_5$$

$$Y_{19} = k_1 \cdot X_8 + k_5 \cdot X_7 + k_9 \cdot X_6$$

$$Y_{22} = k_0 \cdot X_9 + k_4 \cdot X_8 + k_8 \cdot X_7$$

$$Y_{25} = k_3 \cdot X_9 + k_7 \cdot X_8 + k_{11} \cdot X_7$$

$$Y_{28} = k_2 \cdot X_{10} + k_6 \cdot X_9 + k_{10} \cdot X_8$$

are sequentially produced as output data $\{Y_m\}$.

The delay circuits 42A, 42B, 42C and 42D apply unit delay quantities at the $f_{SH}$ rate data to the $f_{SH}$ rate data, and each comprise a D-flipflop performing a latch operation at the $f_{SH}$ rate. The fourth delay circuit 42D simply latches the $f_{SH}$ rate output data $\{Y_i\}$ at an output stage and is not indispensable in the resister postfix type transversal filter.

Since the multipliers 41A, 41B, 41C and 41D multiply filter coefficients 0 with 0 data, the filter coefficient multiplied with the 0 data need not necessarily be 0, while data multiplied by the filter coefficients need not necessarily be zero data.

With the present first embodiment, the input data $\{X_n\}$ having a rate of $F_{SL}$ ($f_{SL}$=13.5 MHz) are converted into output data $\{Y_m\}$ having a rate of $f_{SH}$ ($f_{SH}$=18 MHz) by N:M=3:4 up rate conversion, where M−N=1. It is possible with the rate converter of the present invention to effect up rate conversion of N:M (N<M) with M and N being arbitrary coprime integers.

With the rate converter according to the present invention, described above, a 0 data is inserted at every N data of the $f_{SL}$ rate input data $\{X_n\}$ by the interpolating circuit, and the $f_{SH}$ rate data generated by the interpolating circuit is filtered by a register postfix type transversal filter for achieving up rate conversion of N:M (N<M) for generating $f_{SH}$ rate output data from the $f_{SL}$ rate input data $\{X_n\}$.

The transversal filter for performing such up conversion by sequentially changing over the filter coefficients at the output rate for filtering as proposed in JP Patent Kokai No.4-185774, may also be achieved using a conventional register-prefix transversal filter. However, a fast operation may be realized using a fast process by employing a register post-fix type transversal filter as in the rate converter of the present invention.

Figure 13:
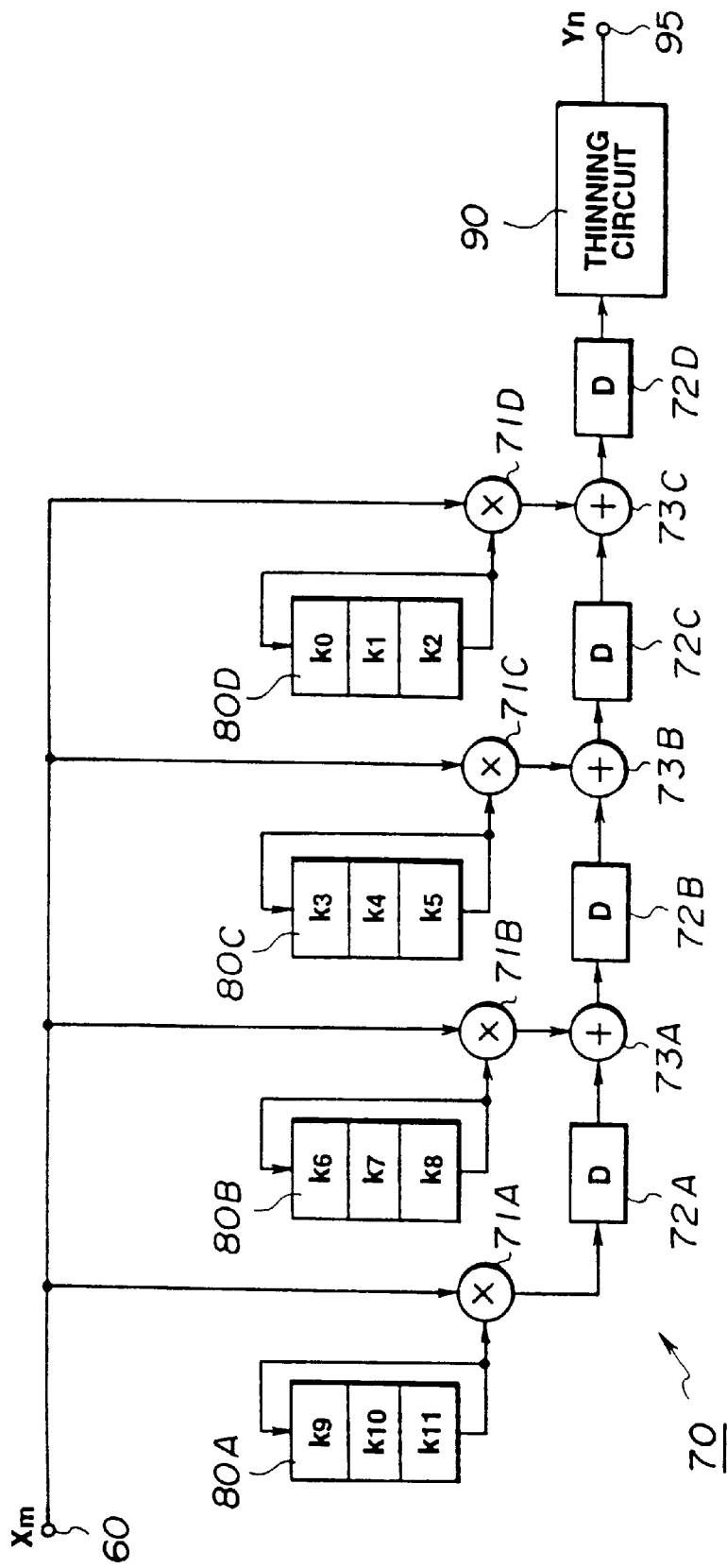
FIG. 13 is a block diagram showing an arrangement of the 3:4 down rate converter according to the present invention.

The rate converter according to the present invention may also be configured as shown in the block diagram of FIG. 13.

In the second embodiment, shown in FIG. 13, the present invention is applied to a down rate converter of performing 4:3 down rate conversion of converting input data $\{X_m\}$ having a rate of $f_{SH}$ ($f_{SH}$=18 MHz) into output data $\{Y_n\}$ having a rate of $f_{SL}$ ($f_{SL}$=13.5 MHz). The rate converter comprises a transversal filter 70 fed with $f_{SH}$ rate input data $\{X_m\}$ via an input terminal 60, four coefficient generators 80A, 80B, 80C and 80D for sequentially applying filter coefficients to the transversal filter 70, and a thinning circuit 90 for thinning the $f_{SH}$ rate data $\{Y_i\}$ filtered by the transversal filter 70 to the $F_{SL}$ for outputting $F_{SL}$ output data $\{Y_m\}$ at an output terminal 95.

In the present second embodiment, the coefficient generators 80A, 80B, 80C, 80D sequentially output the filter coefficients at the $f_{SH}$. Of these, the first coefficient generator 80A repeatedly generates the filter coefficients $k_9$, $k_{10}$, $k_{11}$ at the $f_{SH}$ rate. The second coefficient generator 80B repeatedly generates the filter coefficients $k_6$, $k_7$, $k_8$ at the $f_{SH}$ rate, while the third coefficient generator 80C repeatedly generates the filter coefficients $k_3$, $k_4$, $k_5$ at the $f_{SH}$ rate. The fourth coefficient generator 80D repeatedly generates the filter coefficients $k_0$, $k_1$, $k_2$ at the $f_{SH}$ rate.

The transversal filter 70 processes the $f_{SH}$ rate input data $\{X_m\}$ supplied thereto via the input terminal 60 by rate-converting filtering based on the filter coefficients sequentially supplied from the four coefficient generators 80A, 80B, 80C and 80D.

This transversal filter 70 is a register postfix type or transposed type transversal filter made up of four multipliers 71A, 71B, 71C and 71D, four delay circuits 72A, 72B, 72C and 72D and three additive units 73A, 73B and 73C. The $f_{SH}$ rate input data are supplied via the input terminal 60 simultaneously to the four multipliers 71A, 71B, 71C and 71D.

Of the multipliers 71A, 71B, 71C and 71D, the first multiplier 71A is repeatedly supplied by the coefficient generator 80A with the filter coefficients $k_9$, $k_{10}$, $k_{11}$ at the $f_{SH}$ rate, and multiplies the $f_{SH}$ rate input data $\{Y_m\}$ with the filter coefficients $k_9$, $k_{10}$, $k_{11}$ at the $f_{SH}$ rate. The output product data of the first multiplier 81A is fed to the additive unit 73A via the first delay circuit 72A.

The second multiplier 71B is repeatedly supplied by the coefficient generator 80B with the filter coefficients $k_6$, $k_7$, $k_8$ at the $f_{SH}$ rate, and multiplies the $f_{SH}$ rate input data $\{X_m\}$ with the filter coefficients $k_6$, $k_7$, $k_8$ at the $f_{SH}$ rate. The output product data of the second multiplier 71B is fed to the first additive unit 73A. The output sum data of the first additive unit 73A is fed via the second delay circuit 72B to the second additive unit 73B.

The third multiplier 71C is repeatedly supplied by the coefficient generator 80C with the filter coefficients $k_3$, $k_4$, $k_5$ at the $f_{SH}$ rate, and multiplies the $f_{SH}$ rate input data $\{X_m\}$ with the filter coefficients $k_3$, $k_4$, $k_5$ at the $f_{SH}$ rate. The output product data of the second multiplier 41C is fed to the second additive unit 73B. The output sum data of the second additive unit 73B is fed via the third delay circuit 72C to the third additive unit 73C.

The fourth multiplier 71D is repeatedly supplied by the coefficient generator 80D with the filter coefficients $k_0$, $k_1$, $k_2$ at the $f_{SH}$ rate, and multiplies the $f_{SH}$ rate input data $\{X_m\}$ with the filter coefficients $k_0$, $k_1$, $k_2$ at the $f_{SH}$ rate. The output product data of the fourth multiplier 41D is fed to the third additive unit 73C. The output sum data of the third additive unit 73C is outputted via the fourth delay circuit 72D.

The thinning circuit 90 executes thinning a $f_{SH}$ rate filter output data $\{Y_i\}$ of the transversal filter 70 to the $F_{SL}$ rate to produce =4n data $\{Y_{(4n)}\}$, that is, $$Y_0 = k_1 \cdot X_4 + k_4 \cdot X_3 + k_7 \cdot X_2 + k_{10} \cdot X_1$$

$$Y_4 = k_2 \cdot X_5 + k_5 \cdot X_4 + k_8 \cdot X_3 + k_{11} \cdot X_2$$

$$Y_8 = k_0 \cdot X_7 + k_3 \cdot X_6 + k_6 \cdot X_5 + k_9 \cdot X_4$$

$$Y_{12} = k_1 \cdot X_8 + k_4 \cdot X_7 + k_7 \cdot X_6 + k_{10} \cdot X_5$$

$$Y_{16} = k_2 \cdot X_9 + k_5 \cdot X_8 + k_8 \cdot X_7 + k_{11} \cdot X_6$$

$$Y_{20} = k_0 \cdot X_{11} + k_3 \cdot X_{10} + k_6 \cdot X_9 + k_9 \cdot X_8$$

as output data $\{Y_n\}$ converted from the $f_{SH}$ rate input data into $f_{SL}$ rate data, which are sequentially outputted at the output terminal 95.

The delay circuits 72A, 72B, 72C and 72D apply unit delay quantities at the $f_{SH}$ rate data to the $f_{SH}$ rate and each comprise a D-flipflop performing a latch operation at the $f_{SH}$ rate. The fourth delay circuit 42D simply latches the $f_{SH}$ rate output data $\{Y_i\}$ at an output stage and is not indispensable in the register postfix type transversal filter.

With the present first embodiment, the input data $\{X_n\}$ having a rate of $f_{SH}$ ($f_{SH}$=18 MHz) are converted into output data $\{X_m\}$ having a rate of $f_{SL}$ ($f_{SL}$=13.5 MHz) by N:M=4:3 up rate conversion, where M−N=1. It is possible with the rate converter of the present invention to effect down rate conversion of N:M (N<M) with M and N being arbitrary coprime integers.

With the rate converter of the present invention, described above, the $f_{SH}$ rate input data is filtered by a register postfix type transversal filter and subsequently thinned by a thinning circuit for achieving down rate conversion of M:N (M>N) for generating $f_{SL}$ output data $\{Y_n\}$ from the $f_{SH}$ rate input data $\{X_m\}$.

The transversal filter for filtering by sequentially changing over the filter coefficients at an output rate may be implemented using an ordinary register-prefix type transversal filter for down rate conversion, as proposed in JP Patent Kokai Publication 4-185774. However, a fast operation may be achieved using a fast process by employing a register prefix type transversal filter as in the case of the rate converter according to the present invention.

The register prefix type transversal filters 40, 70 of the first and second embodiments are similarly configured to each other. In addition, the filter coefficients generated by the coefficient generators 30A to 30D and 80A to 80D are the same coefficients except that the output sequence is different. Thus the rate converter for bidirectional rate conversion may be simply implemented by employing a register prefix type transversal filter in common.

Figure 14:
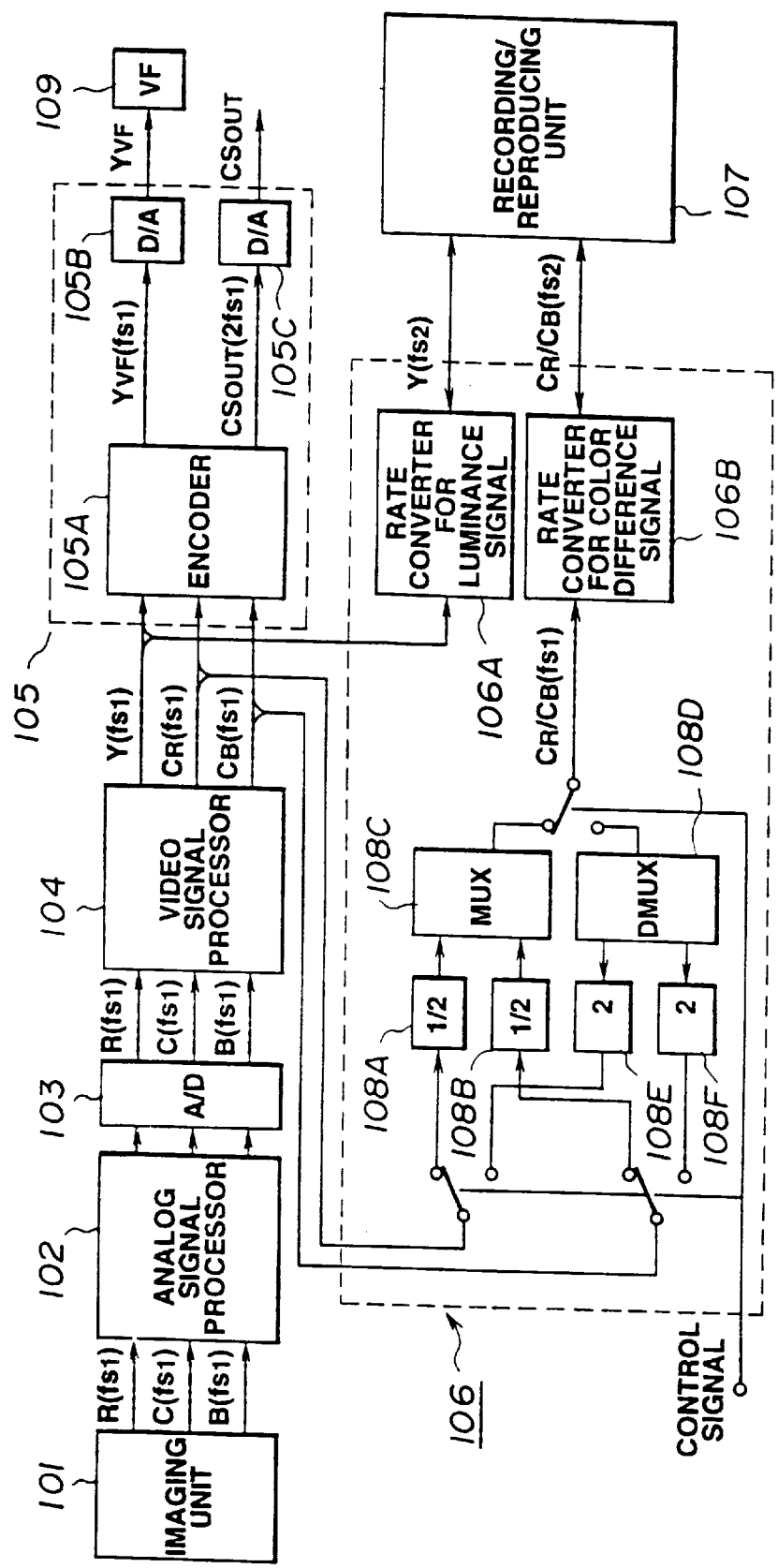
FIG. 14 is a block diagram showing an arrangement of a 3:4 down rate converter according to the present invention.

FIG. 14 shows, in a block diagram, an arrangement of a digital cam corder having a bidirectional rate converter according to the present invention.

The digital cam corder according to a third embodiment of the present invention records imaging signals produced by an imaging unit 101 in a digital form as picture data pursuant to the D1 standard, and includes an analog/digital (A/D) converter 103 fed via an analog signal processor 102 with three color imaging signals $R(f_{s1})$, $G(f_{s1})$ and $B(f_{s1})$ produced by the imaging unit 101, a picture signal processor 104 fed with the imaging data R, G and B digitized by the A/D converter 103, an analog outputting signal processor 105 fed with two digital color difference signals $C_R(f_{s1})$ and $C_B(f_{s1})$ and the digital luminance signals $Y(f_{s1})$ generated by the picture signal processor 104 and rate converting unit 106. A recording/reproducing unit 107 for recording/reproduction of picture data pursuant to the D1 standard is connected to the rate converting unit 106 over a bidirectional bus.

The imaging unit 101 separates the imaging light incident thereon from an imaging lens, not shown, via an optical low-pass filter, into three color components by a color-separating prism for imaging three color images of the object image by three CCD image sensors. These CCD image sensors are driven at the $f_{s1}$ rate so that the color imaging signals $R(f_{s1})$, $G(f_{s1})$ and $B(f_{s1})$ are read at the $f_{s1}$ rate. The three color imaging signals $R(f_{s1})$, $G(f_{s1})$ and $B(f_{s1})$, read out at the $f_{s1}$ rate from the CCD image sensors, are fed via the analog signal processor 102 to the A/D converter 103.

The imaging unit 101 is arranged in accordance with spatial pixel shifting system such that the CCD image sensors for imaging the red-hued picture and the blue-hued picture are shifted in a horizontal direction by one-half the spatial pixel sampling period $\tau_s$ with respect to the green picture imaging CCD image sensor.

The analog signal processor 102 performs correlated dual sampling on the three color imaging signals $R(f_{s1})$, $G(f_{s1})$ and $B(f_{s1})$ read out from the CCD image sensors of the imaging unit 101 for performing level control such as white balance or black balance.

The A/D converter 103 performs A/D conversion synchronized with driving clocks having a pre-set phase at the $f_{s1}$ rate equal to the sampling rate of the three color imaging signals $R(f_{s1})$, $G(f_{s1})$ and $B(f_{s1})$. The $f_{s1}$ rate three color imaging signals $R(f_{s1})$, $G(f_{s1})$ and $B(f_{s1})$ digitized by the A/D converter 103 are fed to the picture signal processor 104.

The picture signal processor 104 performs picture enhancement, pedestal addition, non-linear processing, such as gamma or knee processing or linear matrix processing on the three color imaging signals $R(f_{s1})$, $G(f_{s1})$ and $B(f_{s1})$ fed from the A/D converter 103, while performing matrix processing for generating the two digital color difference signals $C_R(f_{s1})$ and $C_B(f_{s1})$ and the digital luminance signals $Y(f_{s1})$ from the three color imaging signals $R(f_{s1})$, $G(f_{s1})$ and $B(f_{s1})$.

The picture signal processor 104 performs well-known high resolution processing corresponding to the spatial pixel shifting method in the imaging unit 101, with the clocks at the $f_{s1}$ rate as master clocks, and generates the $f_{s1}$ rate two digital color difference signals $C_R(f_{s1})$ and $C_B(f_{s1})$ and digital luminance signals $Y(f_{s1})$ from the three color imaging signals $R(f_{s1})$, $G(f_{s1})$ and $B(f_{s1})$. The analog signal outputting signal processor 105 functions as an analog interface for the $f_{s1}$ rate two digital color difference signals $C_R(f_{s1})$ and $C_B(f_{s1})$ and digital luminance signals $Y(f_{s1})$ generated by the picture signal processor 104 or the rate converting unit 106, and is made up of a digital encoder 105A and respective digital/analog converters 105B, 105C. The analog signal outputting signal processor 105 generates digital composite signals $CS_{OUT}(2f_{s1})$ and a digital monitor signal $Y_{VF}(f_{s1})$ by the digital encoder 105A conforming to the usual NTSC or PAL system. The digital composite signals $CS_{OUT}(2f_{s1})$ are converted into analog signals by the D/A converter 105C for outputting a monitor signal $Y_{VF}$ to be fed to a view finder 109. On the other hand, the digital composite signal $CS_{OUT}(2f_{s1})$ is converted by the D/A converter 105C into analog signals for outputting a composite video signal CS.

The rate converting processor 106 effects bidirectional rate conversion between the $f_{s1}$ rate related data rate signals and the $f_{s2}$ rate related data rate signals. During the recording mode, the rate converting unit 106 converts the $f_{s1}$ rate related data rate signals generated by the picture signal processor 104, that is, signals $Y(f_{s1})$, $C_R(f_{s1}/2)$, $C_B(f_{s1}/2)$ into the $f_{s2}$ rate related data rate signals $Y(f_{s2})$, $C_R(f_{s2}/2)$, $C_B(f_{s2}/2)$ which are fed to the recording/reproducing unit 107. During the reproducing mode, the rate converting unit 106 converts the $f_{s2}$ rate related data rate signals supplied by the recording/reproducing unit 107, that is, signals $Y(f_{s2})$, $C_R(f_{s2}/2)$, $C_B(f_{s2}/2)$ into the $f_{s1}$ rate related data rate signals $Y(f_{s1})$, $C_R(f_{s1}/2)$, $C_B(f_{s1}/2)$ which are fed to the analog signal outputting signal processor 105.

The rate converting processor 106 comprises a rate converting circuit 106A for luminance signals and a rate converting circuit 106B for color difference signals.

Figure 15:
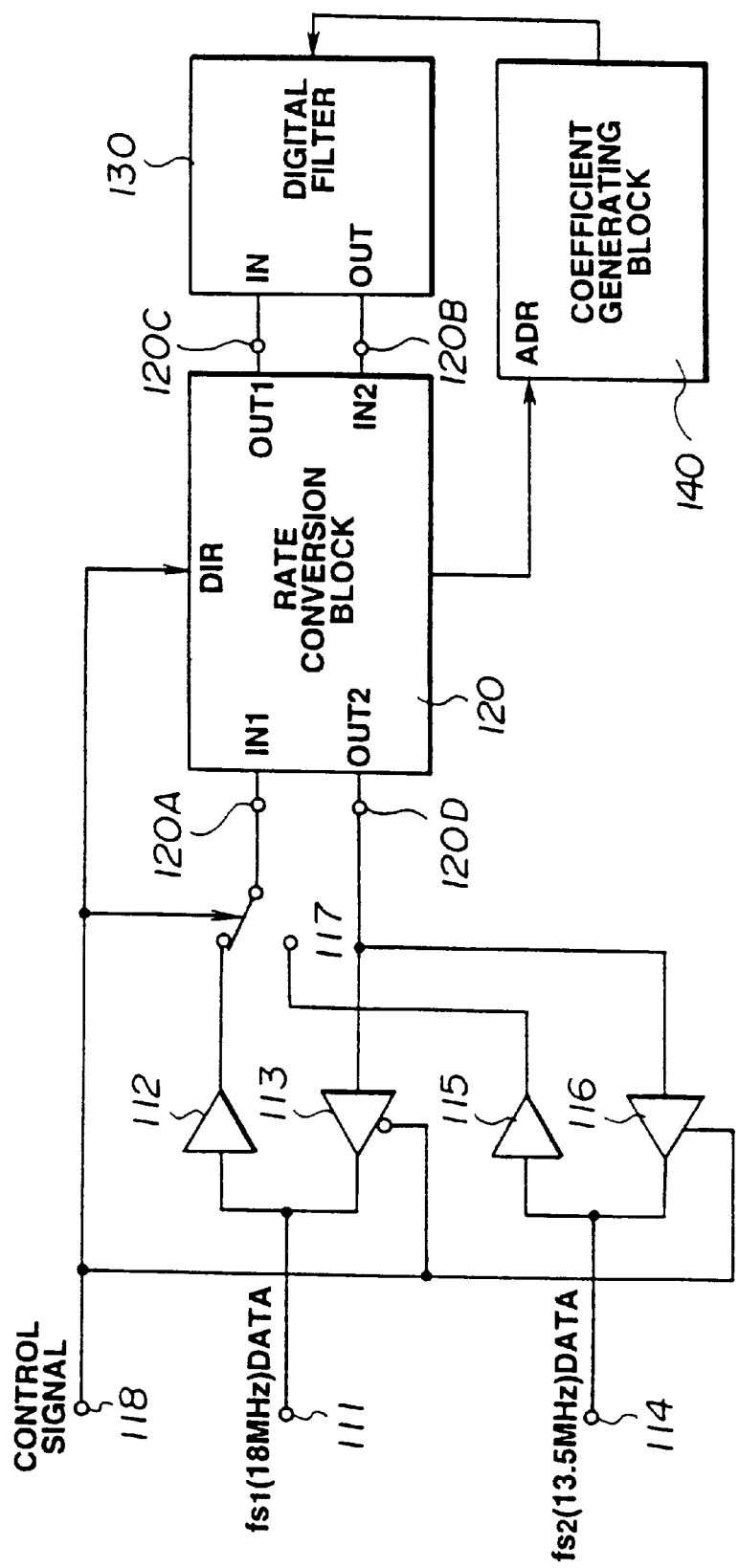
FIG. 15 is a conceptual block diagram showing an arrangement of the above bidirectional rate converter.

The rate converting circuit 106A for luminance signals i a bidirectional rate converter according to the present invention and comprises a rate converting block 120, a digital filter block 130 and a filter coefficient generating block 140, as shown in the conceptual block diagram of FIG. 15.

In the conceptual block diagram of FIG. 15, a terminal 111 is a first input/output terminal connected over a bidirectional bus to the picture signal processor 104 and the analog signal outputting signal processor 105. To this first input/output terminal 111 are connected an input end of a line receiver 112 and an output end of a line driver 113. On the other hand, a terminal 114 is a second input/output terminal connected over a bidirectional bus to the recording/reproducing unit 107. To this second input/output terminal 114 are connected an input end of a line receiver 115 and an output end of a line driver 116.

To a first input terminal 120A of the rate converting block 120 are connected respective output ends of the line receivers 112, 115 via a changeover switch 117. The changeover switch 117 is controlled by the control signal supplied via a terminal 118 to select the output end of the line receiver 112 and the output end of the line receiver 115 during the recording mode and during the playback mode, respectively. Thus the first input terminal 120A of the rate converting block 120 is fed during the recording mode with the $f_{s1}$ rate digital luminance signals $y(f_{s1})$ from the picture signal processor 104 via the changeover switch 117, while being fed during the reproducing mode with the $f_{s2}$ rate digital luminance signals $y(f_{s2})$ from the recording/reproducing unit 107 via the changeover switch 117.

The rate converting block 120 has its first output terminal 120C connected to an input terminal of the digital filter block 130, an output terminal of which is connected to the second input terminal 120B of the rate converting block 120.

The rate converting block 120 has its second output terminal 120D connected to the first input/output terminal 111 via the line driver 113 and to the second input/output terminal 114 via the line driver 116. The line drivers 113, 116 are controlled by a control signal supplied via the terminal 118 so that the line driver 115 is in the operative state with the line driver 113 being inoperative during the recording mode and the line driver 113 is in the operative state with the line driver 115 being inoperative during the reproducing mode. Thus the converted output of the second output terminal 120D of the rate converting bock 120 is supplied during the recording mode from the second input/output terminal 114 to the recording/reproducing unit while being supplied during the replay mode from the first input/output terminal 111 to the analog signal outputting signal processor 105.

The rate converting block 120 is controlled by the control signal supplied via the terminal 118 so that, during the recording mode, the $f_{s1}$ rate ($f_{s1}$=18 MHz, for example) digital luminance signal Y($f_{s1}$) supplied from the picture signal processor 104 via the changeover switch 117 to the first input terminal 120A is converted by thinning to the $f_{s2}$ rate ($f_{s2}$=13.5 MHz, for example) digital luminance signal Y($f_{s2}$) pursuant to the D1 standard, and so that, during the replay mode, the $f_{s2}$ rate ($f_{s2}$=13.5 MHz, for example) digital luminance signal Y($f_{s2}$) pursuant to the D1 standard, supplied from the recording/reproducing unit 107 via the changeover switch 117 to the first input terminal 120A, is converted into the $f_{s1}$ rate ($f_{s1}$=18 MHz, for example) digital luminance signal Y($f_{s1}$).

Figure 16:
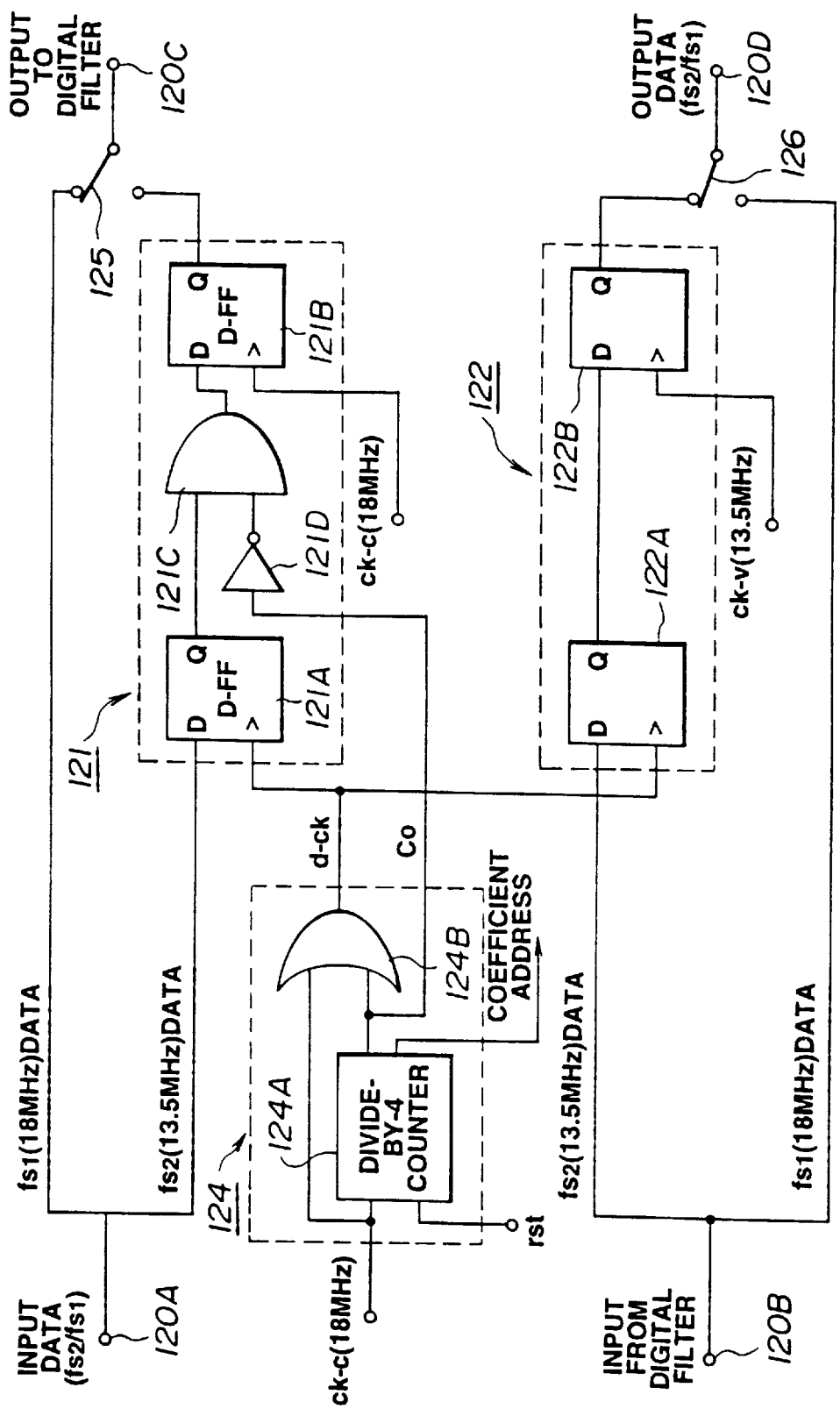
FIG. 16 is a block diagram showing a practical arrangement of a rate conversion block in the above bidirectional rate converter.

The rate converting block 120 is made up of an interpolating circuit 121 a thinning circuit 122, a clock generator 124, a first changeover switch 125 and a second changeover switch 126, as shown for example in the block diagram of FIG. 16.

The first changeover switch 125 selects signals outputted at the first output terminal 120C and is controlled by a control signal supplied via a terminal 118 for outputting the $f_{s1}$ rate digital luminance signal Y($f_{s1}$) ($f_{s1}$=18 MHz) supplied at the input terminal 120A directly at the first output terminal 120C during the recording mode, and for outputting the $f_{s1}$ rate digital luminance signal Y($f_{s1}$) ($f_{s1}$=18 MHz) produced by interpolating the $f_{s2}$ rate digital luminance signal Y($f_{s2}$) ($f_{s2}$=13.5 MHz) by the interpolating circuit 121.

The interpolating circuit 121 comprises first and second D flipflops 121A, 121B, an AND gate 121C and an inverter 121D.

Figure 17:
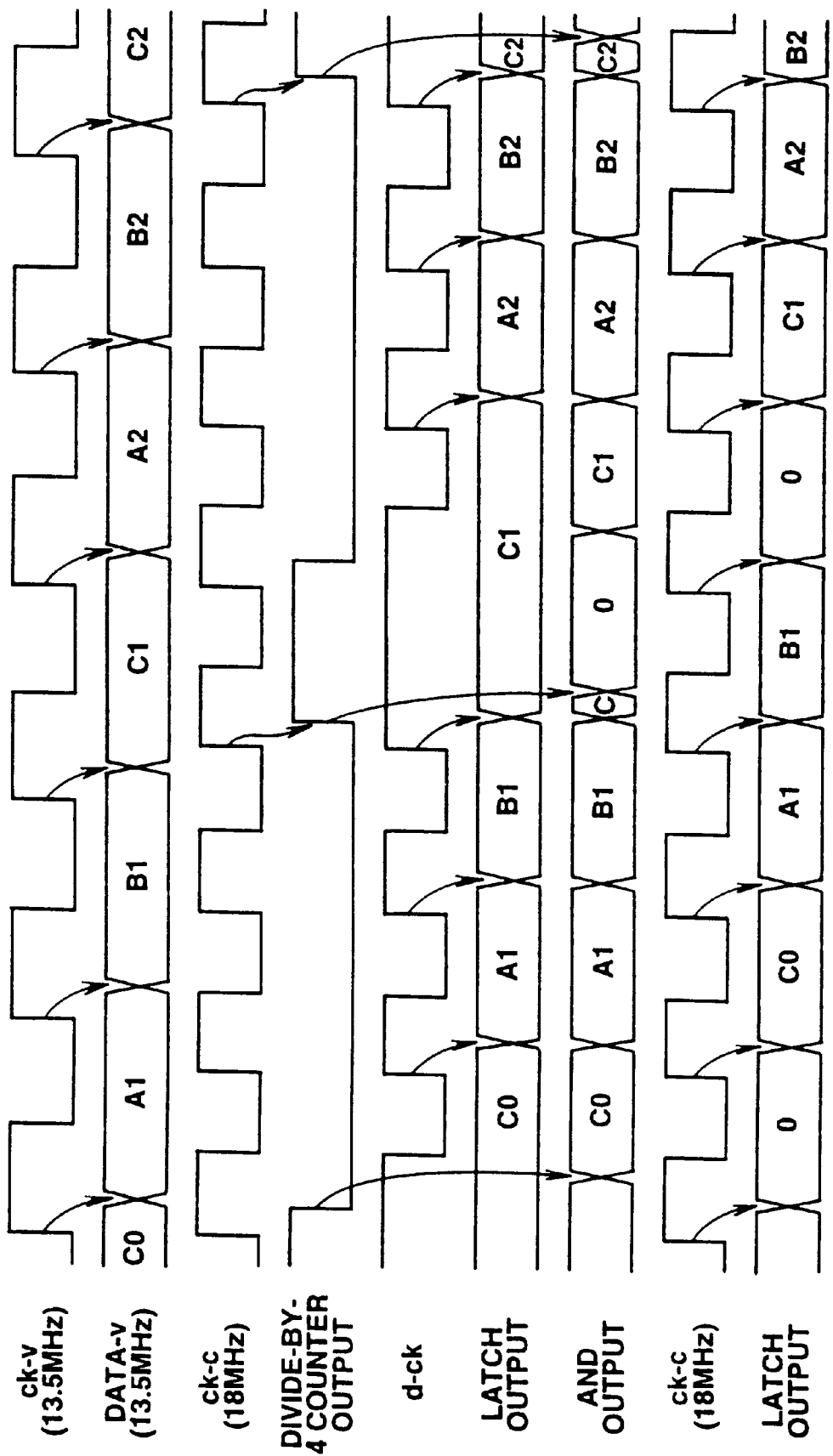
FIG. 17 is a timing chart for illustrating the interpolation executed by the rate conversion block.

The first D flipflop 121A latches the $f_{s2}$ rate digital luminance signal Y($f_{s2}$) ($f_{s2}$=13.5 MHz) supplied during the replay mode to the first input terminal 120A with a data latch clock d-ck, having the timing shown in FIG. 17, supplied from the clock generator 124. The AND gate 121C ANDs the latch output data from the first D flipflop 121A and the zero insertion data, having the timing of FIG. 17, supplied from the clock generator 124. The second D flipflop 121B latches the AND output data of the AND gate 121C by the latch clock having the $f_{s1}$ rate ($f_{s1}$=18 MHz) at the timing shown in FIG. 17. The latch output data of the second D flipflop 121B is the $f_{s1}$ rate digital luminance signal Y($f_{s1}$) ($f_{s1}$=18 MHz).

The second changeover switch 126 selects signals outputted at the first output terminal 120D and is controlled by a control signal supplied via the terminal 118 for outputting the $f_{s2}$ rate digital luminance signal Y($f_{s2}$) ($f_{s2}$=13.5 mHz) produced by thinning the $f_{s1}$ rate digital luminance signal Y($f_{s1}$) ($f_{s1}$=18 MHz) supplied to the second terminal 120B by the thinning circuit 122 during the recording mode and for outputting the $f_{s1}$ rate digital luminance signal Y($f_{s1}$) ($f_{s1}$=18 MHz) supplied to the second input terminal 120B at the second output terminal 120D during the replay mode.

Figure 18:
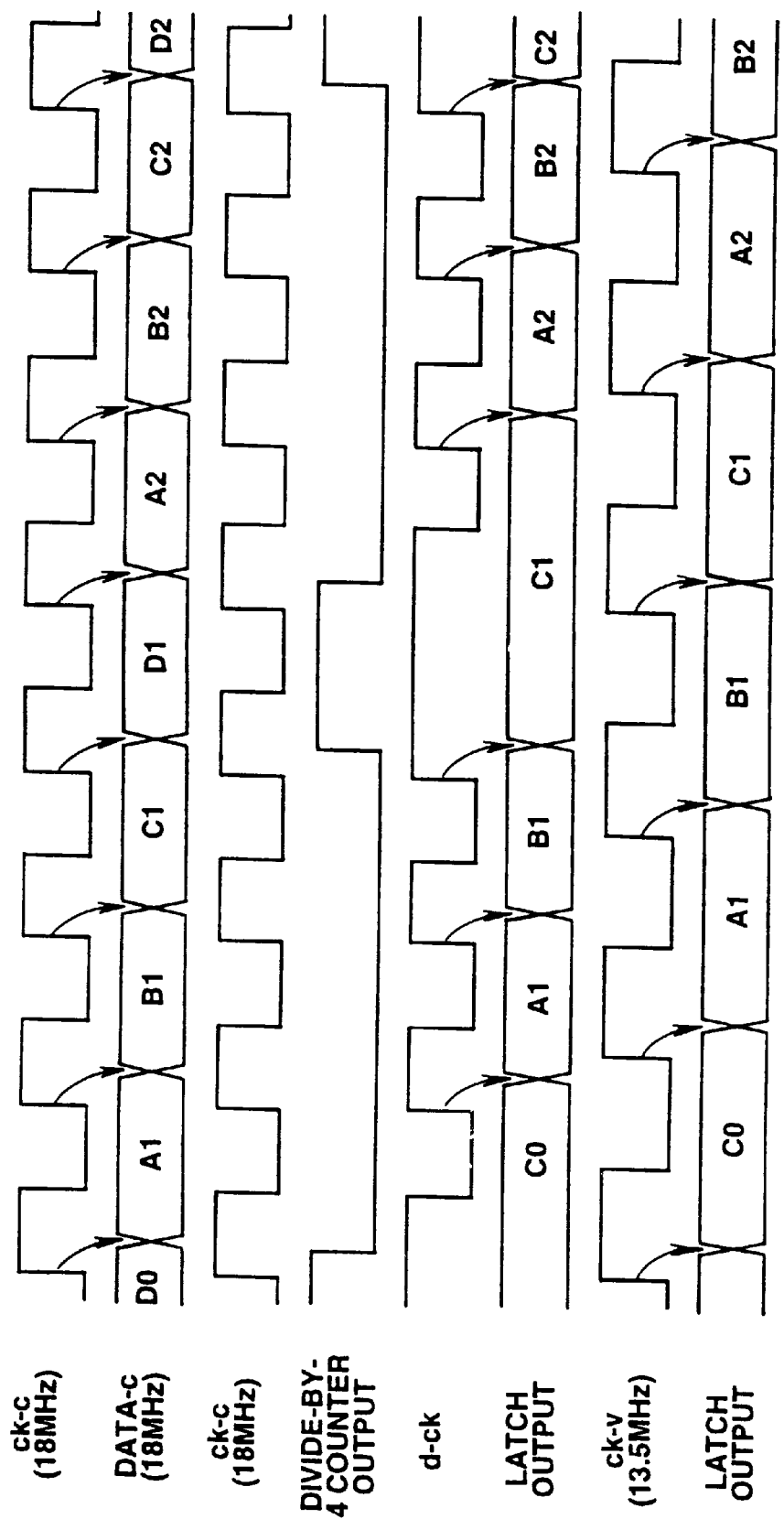
FIG. 18 is a timing chart for illustrating the thinning executed by the rate conversion block.

The thinning circuit 122 comprises first and second D flipflops 122A, 122B and generates the $f_{s2}$ rate digital luminance signal Y($f_{s2}$) ($f_{s2}$=13.5 MHz) by latching the $f_{s1}$ rate digital luminance signal Y($f_{s1}$) ($f_{s1}$=18 MHz) supplied to the second input terminal 120B by the data latch clock d-ck of the timing shown in FIG. 18, supplied from the clock generator 124 by the first D flipflop 122A, and by re-latching the latch output data with the latch clock of the $f_{s2}$ rate ($f_{s2}$=13.5 MHz) at the timing shown in FIG. 18.

The clock generator 124 comprises a divide-by-4 counter 124A for generating the zero insertion data Co and the coefficient address data ADR by counting,the clocks ck-c of the $f_{s1}$ rate ($f_{s2}$=18 MHz). The divide-by-4 counter 124A is reset by a reset signal rst generated on power up or at the timing of the horizontal synchronization. The divide-by-4 counter 124A applies the generated coefficient address data ADR to the coefficient generating block.

Figure 19:
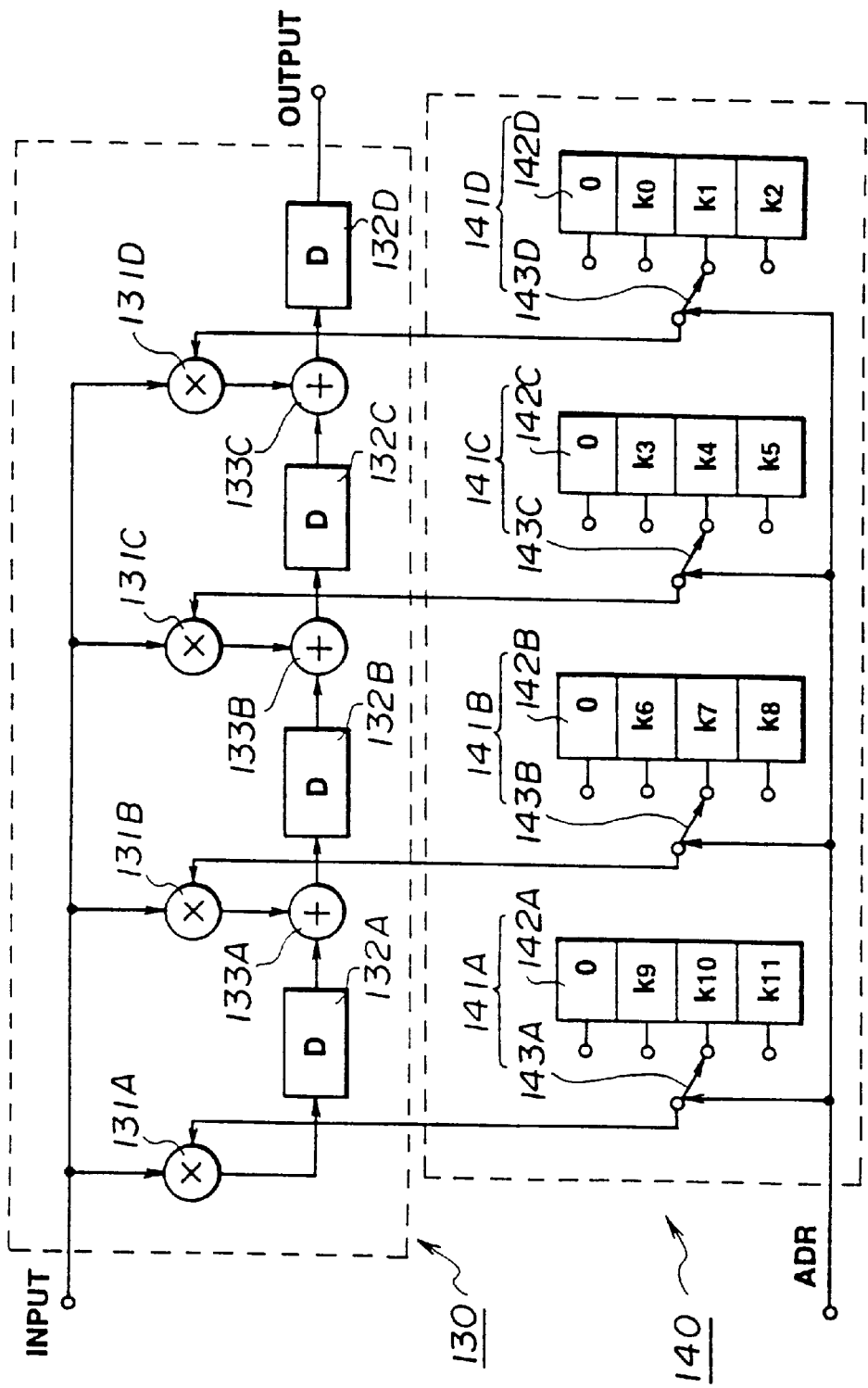
FIG. 19 is a block diagram showing a practical arrangement of a digital filter block in the above bidirectional rate converter.

The digital filter block 130 and the coefficient generating block 140 are configured as shown for example in FIG. 19.

This digital filter block 130 is a register postfix type transversal filter made up of four multipliers 131A, 131B, 131C and 131D, four delay circuits 132A, 132B, 132C and 132D and three additive units 133A, 133B and 133C. An output of the rate converting block 120 is simultaneously applied to the four multipliers 131A to 131D.

Of the multipliers 131A, 131B, 131C and 131D, the first multiplier 131A is repeatedly supplied by the first coefficient generator 140A of the coefficient, generating block 140 with the filter coefficients repeatedly supplied at the $f_{s1}$ rate, and multiplies the output of the rate converting block 120 with the filter coefficients. The output product data of the first multiplier 131A is fed to the additive unit 133A via the first delay circuit 132A.

The second multiplier 131B is repeatedly supplied by the second coefficient generator 140B of the coefficient generating block 140 with the filter coefficients, repeatedly supplied at the $f_{s1}$ rate, and multiplies the output of the rate converting block 120 with the filter coefficients. The output product data of the second multiplier 131B is fed, to the first additive unit 133A, the sum output data of which is fed via the second delay circuit 132B to the second additive unit 133B.

The third multiplier 131C is repeatedly supplied by the third coefficient generator 140C of the coefficient generating block 140 with the filter coefficients repeatedly, supplied at the $f_{s1}$ rate, and multiplies the output of the rate converting block 120 with the filter coefficients. The output product data of the third multiplier 131C is fed to the second additive unit 133B, the sum output data of which is fed via the third delay circuit 132B to the third additive unit 133C.

The fourth multiplier 131D is repeatedly supplied by the fourth coefficient generator 140D of the coefficient generating block 140 with the filter coefficients repeatedly supplied at the $f_{s1}$ rate, and multiplies the output of the rate converting block 120 with the filter coefficients. The output product data of the fourth multiplier 131D is fed to the third additive unit 133C, the sum output data of which is fed via the fourth delay circuit 132D to the second input terminal 120B of the digital filter block 130.

The coefficient generating block 140 comprises four coefficient generators 141A, 141B, 141C and 141D.

The first coefficient generator 141A of the coefficient generating block 140 has a coefficient memory 142A storing filter coefficients $k_{11}$, $k_{10}$, $k_9$, 0 and a selector 143A for selectively outputting the coefficients $k_{11}$, $k_{10}$, $k_9$, 0 from the coefficient memory 142A. The selector 143A executes its selecting operation responsive to the address data ADR supplied from the divide-by-4 counter 124A of the clock generator 124 and repeatedly outputs the filter coefficients $k_{11}$, $k_{10}$, $k_9$, 0 at the $f_{s1}$ rate during the recording mode, while repeatedly outputting the filter coefficients $k_9$, $k_{10}$, $k_{11}$ at the $f_{s1}$ rate during the replay mode.

The second coefficient generator 141B has a coefficient memory 142B for storing filter coefficients $k_8$, $k_7$, $k_6$, 0 and a selector 143B for selectively outputting the coefficients $k_8$, $k_7$, $k_9$, 0 from the coefficient memory 142B. The selector 143B executes its selecting operation responsive to the address data ADR supplied from the divide-by-4 counter 124A of the clock generator 124 and repeatedly outputs the filter coefficients $k_8$, $k_7$, $k_6$, 0 at the $f_{s1}$ rate during the recording mode, while repeatedly outputting the filter coefficients $k_6$, $k_7$, $k_8$ at the $f_{s1}$ rate during the replay mode.

The third coefficient generator 141C has a coefficient memory 142C for storing filter coefficients $k_5$, $k_4$, $k_3$, 0 and a selector 143C for selectively outputting the coefficients $k_5$, $k_4$, $k_3$, 0 from the coefficient memory 142C. The selector 143C executes its selecting operation responsive to the address data ADR supplied from the divide-by-4 counter 124A of the clock generator 124 and repeatedly outputs the filter coefficients $k_5$, $k_4$, $k_3$, 0 at the $f_{s1}$ rate during the recording mode, while repeatedly outputting the filter coefficients $k_3$, $k_4$, $k_1$ at the $f_{s1}$ rate during the replay mode.

The fourth coefficient generator 141D of the coefficient generating block 140 has a coefficient memory 142C for storing filter coefficients $k_2$, $k_1$, $k_0$, 0 and a selector 143C for selectively outputting the coefficients $k_2$, $k_1$, $k_0$, 0 from the coefficient memory 142D. The selector 143D executes its selecting operation responsive to the address data ADR supplied from the divide-by-4 counter 124A of the clock generator 124 and repeatedly outputs the filter coefficients $k_2$, $k_1$, $k_0$, 0 at the $f_{s1}$ rate during the recording mode, while repeatedly outputting the filter coefficients $k_0$, $k_1$, $k_2$ at the $f_{s1}$ rate during the replay mode.

The rate converting circuit 106B for color difference signals is fed with $f_{s1}$ rate digital color difference signals $C_R(f_{s1})$, $C_B(f_{s1})$ after being lowered to the $f_{s1}/2$ rate by ½ sepdown circuits 108A, 108B and arrayed dot-sequentially by a multiplexor 108C, that is as a $f_{s1}$ rate digital dot-sequential color difference signal $C_R/C_B$ ($f_{s1}$). The rate converting circuit 106B down-converts the rate of the signal into a $f_{s2}$ rate digital dot-sequential color difference signal $C_R/C_B$ ($f_{s2}$).

During the replay mode, the $f_{s2}$ rate digital dot-sequential color difference signal $C_R/C_B$ ($f_{s2}$) is up rate converted into the $f_{s1}$ rate digital dot-sequential color difference signal $C_R/C_B$ ($f_{s1}$) Thus the present rate conversion circuit 106B for the color difference signals is a bidirectional rate converter according to the present invention and, as a principle, performs rate conversion similar to that performed by the above-described rate conversion circuit 106Y for luminance signals.

The $f_{s1}$ rate digital dot-sequential color difference signal $C_R/C_B$ ($f_{s1}$), produced by the rate conversion circuit 106B for color difference signals, is rendered parallel by the digital multiplexor 108D and thus converted into $f_{s1}/2$ rate digital color difference signals $C_R(f_{s1}/2)$, $C_B(f_{s1}/2)$, which then are doubled in rate by doublers 108E, 108F into $f_{s1}$ rate digital color difference signals $C_R(f_{s1})$, $C_B(f_{s1})$ which are supplied to the digital encoder 105A of the signal processor 105.

Figure 20:
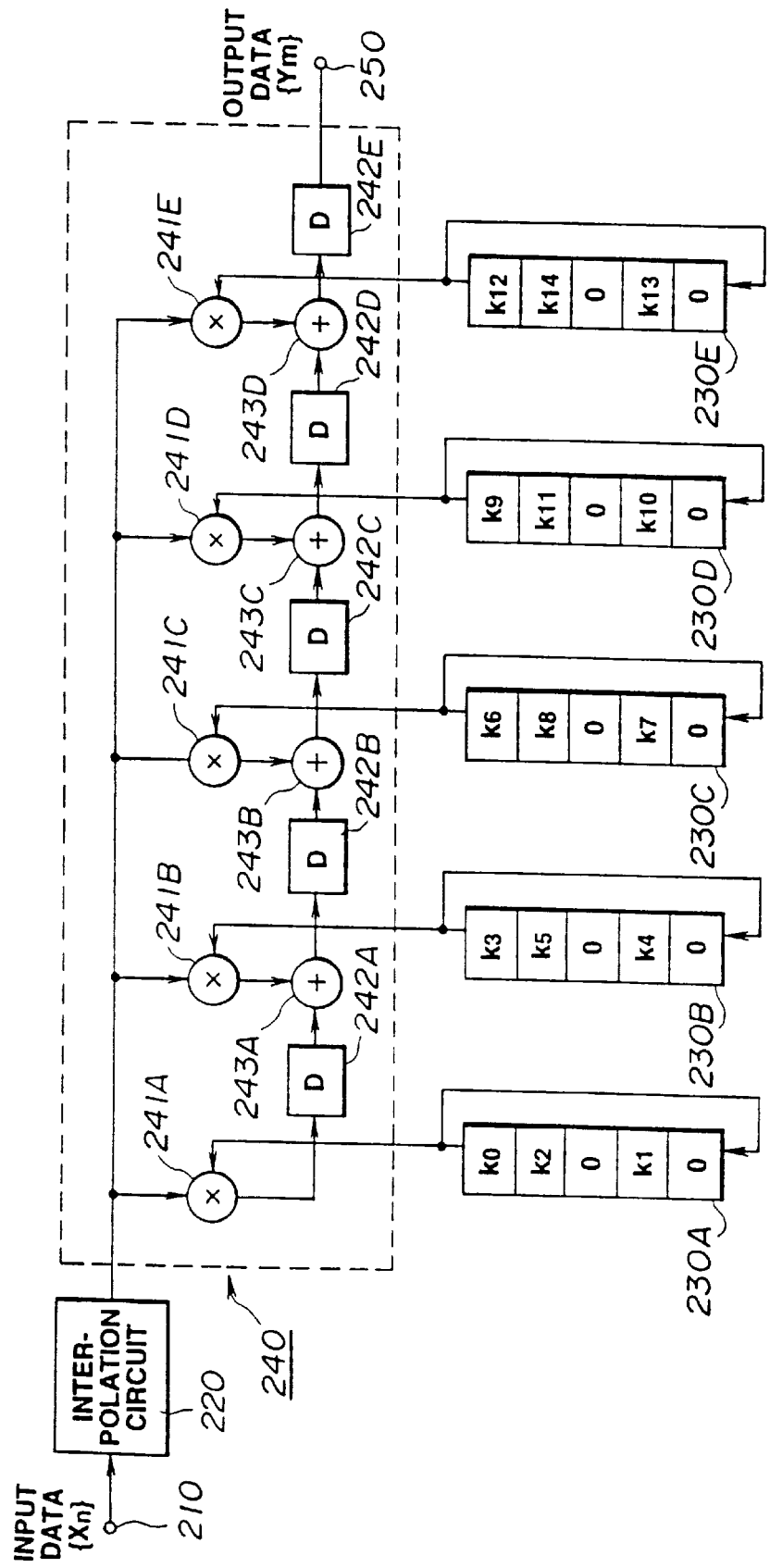
FIG. 20 is a block diagram showing an arrangement of a 5:3 down rate converter according to the present invention.

The rate converter according to the present invention is configured as shown in the block diagram of FIG. 20.

With the fourth embodiment, shown in FIG. 20, the present invention is applied to a 3:5 up rate converter for converting the $F_{SL}$ rate input data $\{X_n\}$ into $f_{SH}$ rate output data $\{Y_m\}$. The rate converter comprises an interpolating circuit 220 for interpolating the $F_{SL}$ rate input data $\{X_n\}$, entered via an input terminal 210, for generating the $f_{SH}$ rate data, five coefficient generators 230A, 230B, 230C 230D and 230E for outputting respective filter coefficients and a transversal filter 240 for filtering the $f_{SH}$ rate data generated by the interpolation circuit 220 based on the above-mentioned filter coefficients for outputting the $f_{SH}$ rate output data $\{Y_m\}$ at an output terminal 240.

The interpolation circuit 220 inserts two 0 data for every five data of the $F_{SL}$ rate input data $\{X_n\}$ entered at the input terminal 210 for generating $f_{SH}$ data.

The coefficient generators 230A, 230B, 230C, 230D and 230E sequentially output respective filter coefficients at the $f_{SH}$ rate. Thus the first coefficient generator 230A repeatedly generates filter coefficients $k_0$, $k_2$, 0, $k_1$, 0 at the $f_{SH}$ rate, while the second coefficient generator 230B repeatedly generates filter coefficients $k_3$, $k_5$, 0, $k_4$, 0 at the $f_{SH}$ rate. The third coefficient generator 230C repeatedly generates filter coefficients $k_6$, $k_8$, 0, $k_7$, 0 at the $f_{SH}$ rate, while the fourth coefficient generator 230D repeatedly generates filter coefficients $k_3$, $k_{11}$, 0, $k_{10}$, 0 at the $f_{SH}$ rate. The fifth coefficient generator 230E repeatedly generates filter coefficients $k_{12}$, $k_{14}$, 0, $k_{13}$, 0 at the $f_{SH}$ rate.

The transversal filter 240 processes the $f_{SH}$ rate data generated by the interpolation circuit 220 by rate-converting filtering based on the filter coefficients sequentially supplied from the four coefficient generators 230A, 230B, 230C and 230D. This transversal filter 230 is, a register postfix type transversal filter made up of five multipliers 241A, 241B, 241C, 241D and 241E, five delay circuits 242A, 242B, 242C, 242D and 242E and four additive units 243A, 243B, 243C and 243D. The $f_{SH}$ rate input data, generated by the interpolation circuit 220, are simultaneously supplied to the five multipliers 241A, 241B, 241C, 241D and 241E.

Of the multipliers 241A, 241B, 241C, 241D and 241E, the first multiplier 241A is repeatedly supplied by the coefficient generator 230A with the filter coefficients $k_0$, $k_2$, 0, $k_1$, 0 at the $f_{SH}$ rate, and multiplies the $f_{SH}$ rate data generated by the interpolating circuit 220 with the filter coefficients $k_0$, $k_2$, 0, $k_1$, 0 at the $f_{SH}$ rate. The output product data of the first multiplier 241A is fed to the additive unit 243A via the first delay circuit 242A.

The second multiplier 241B is repeatedly supplied by the coefficient generator 230B with the filter coefficients $k_3$, $k_5$, 0, $k_4$, 0 at the $f_{SH}$ rate, and multiplies the $f_{SH}$ rate data generated by the interpolating circuit 220 with the filter coefficients $k_3$, $k_4$, 0, $k_4$, 0 at the $f_{SH}$ rate. The product output data of the second multiplier 241B is fed to the first additive unit 243A. The sum output data of the first additive unit 243A is fed via the second delay circuit 242B to the second additive unit 243B.

The third multiplier 241C is repeatedly supplied by the coefficient generator 230C with the filter coefficients $k_6$, $k_8$, 0, $k_7$, 0 at the $f_{SH}$ rate, and multiplies the $f_{SH}$ rate data generated by the interpolating circuit 220 with the filter coefficients $k_6$, $k_8$, 0, $k_7$, 0 at the $f_{SH}$ rate. The product output data of the third multiplier 241C is fed to the second additive unit 243B. The sum output data of the second additive unit 243B is fed via the third delay circuit 242C to the third additive unit 243C.

The fourth multiplier 241D is repeatedly supplied by the coefficient generator 230D with the filter coefficients $k_9$, $k_{11}$, 0, $k_{10}$, 0 at the $f_{SH}$ rate, and multiplies the $f_{SH}$ rate data generated by the interpolating circuit 220 with the filter coefficients $k_9$, $k_{11}$, 0, $k_{10}$, 0 at the $f_{SH}$ rate. The product output data of the fourth multiplier 241D is fed to the third additive unit 243D. The sum output data of the third additive unit 243C is fed via the fourth delay circuit 242D to the fourth additive unit 243D.

The fifth multiplier 241E is repeatedly supplied by the coefficient generator 230E with the filter coefficients $k_{12}$, $k_{14}$, 0, $k_{13}$, 0 at the $f_{SH}$ rate, and multiplies the $f_{SH}$ rate data generated by the interpolating circuit 220 with the filter coefficients $k_{12}$, $k1_4$, 0, $k_{13}$, 0 at the $f_{SH}$ rate. The product output data of the fifth multiplier 241E is fed to the fourth additive unit 243D. The sum output data of the fourth additive unit 243A is fed via the fifth delay circuit 242E to the fifth additive unit 243E.

At an output terminal 250 of the above-described transversal filter 240, i=3m+1 data $\{Y_i\}$, that is $$Y_1 = k_0 \cdot X_1 + k_5 \cdot X_2 + 0 \cdot 0 + k_{10} \cdot X_3 + 0 \cdot 0$$

$$Y_4 = k_2 \cdot X_2 + 0 \cdot 0 + k_7 \cdot X_3 + 0 \cdot 0 + k_{12} \cdot X_4$$

$$Y_7 = 0 \cdot 0 + k_4 \cdot X_3 + 0 \cdot 0 + k_9 \cdot X_4 + k_{14} \cdot X_5$$

$$Y_{10} = k_1 \cdot X_3 + 0 \cdot 0 + k_6 \cdot X_4 + k_{11} \cdot X_5 + 0 \cdot 0$$

$$Y_{13} = 0 \cdot 0 + k_3 \cdot X_4 + k_5 \cdot X_5 + 0 \cdot 0 + k_{13} \cdot X_6$$

$$Y_{16} = k_0 \cdot X_4 + k_5 \cdot X_6 + 0 \cdot 0 + k_{10} \cdot X_6 + 0 \cdot 0$$

$$Y_{19} = k_2 \cdot X_5 + 0 \cdot 0 + k_7 \cdot X_6 + 0 \cdot 0 + k_{12} \cdot X_7$$

are produced sequentially as output data $\{Y_m\}$ converted from the $F_{SL}$ input data $\{X_n\}$ by rate conversion to the $f_{SH}$ rate.

The output data $\{Y_m\}$ produced at the output terminal 250 is equivalent to $f_{SH}$ rate data ($f_{SH}$=5/3 $f_{SL}$) generated by filtering 5 $F_{SL}$ rate data, generated by inserting four 0s between data of the $F_{SL}$ rate input data $\{X_n\}$, by a transversal filter operating at the 5 $f_{SL}$ rate, and extracting every third data.

The delay circuits 242A, 242B, 242C, 242D and 242E apply unit delay quantities at the $f_{SH}$ rate data to the $f_{SH}$ rate data and respectively comprise D-flipflops performing a latch operation at the $f_{SH}$ rate. The fifth delay circuit 242E simply latches the $f_{SH}$ rate output data $\{Y_i\}$ at an output stage and is not indispensable in the register postfix type transversal filter.

On the other hand, since the multipliers 241A, 241B, 241C, 241D and 241E multiply 0 data with the filter coefficients 0, the filter coefficients by which the 0 data is multiplied need not necessarily be 0, while data by which the filter coefficient 0 is multiplied need not necessarily be 0 data.

With the present fourth embodiment, N:M=3:5 up rate conversion is carried out with M−N=2. However, an up rate conversion by N:M, where N<M, may also be performed, with M−N being an arbitrary integer.

Thus, with the rate converter of the present invention, it is possible to achieve up rate conversion of N:M, where N<M, by inserting (M−N) 0 data at every N data of the $F_{SL}$ rate input data $\{X_n\}$ by an interpolation circuit, for generating $f_{SH}$ rate data, and by filtering the $f_{SH}$ data generated by the interpolation circuit by a register postfix type transversal filter.

Figure 21:
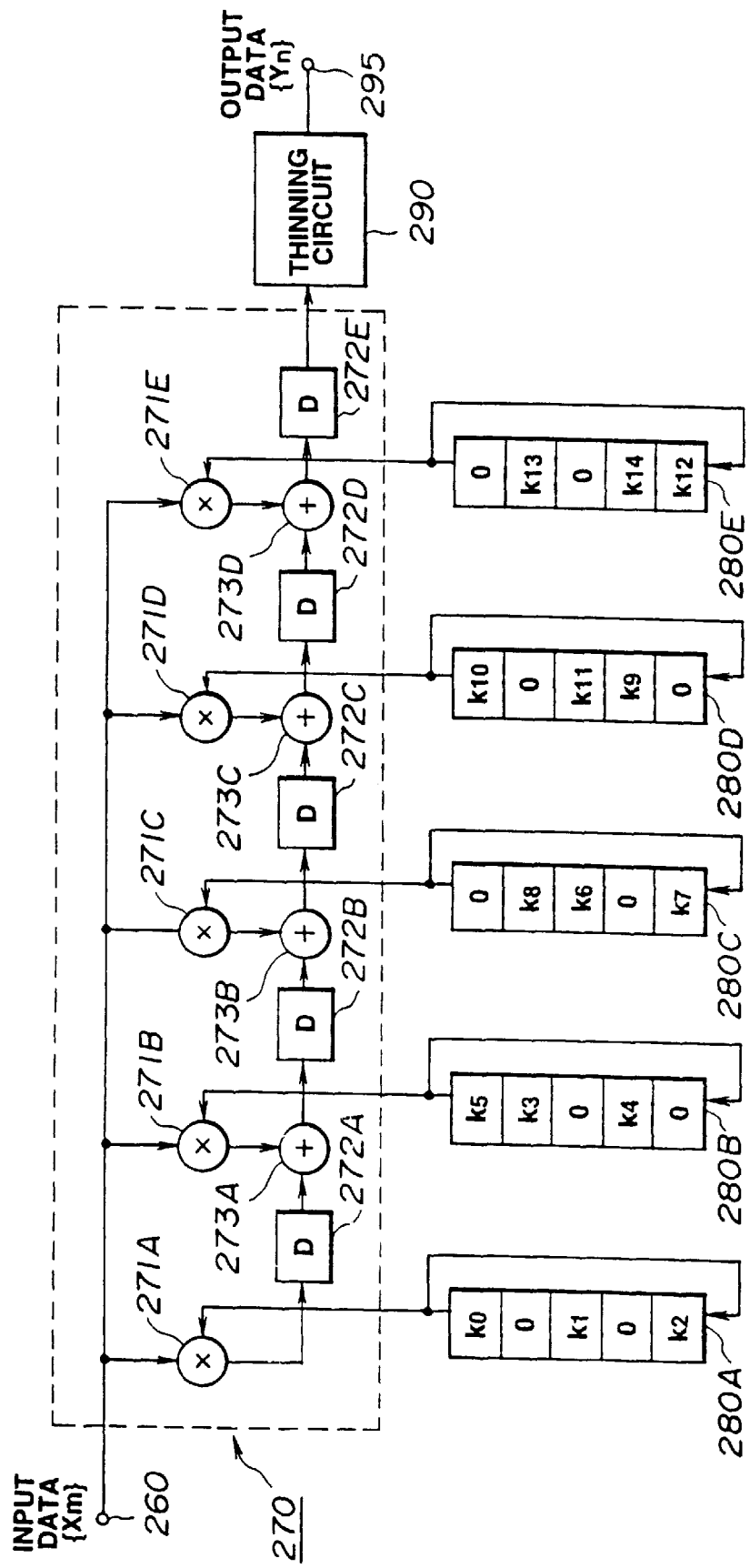
FIG. 21 is a block diagram showing an arrangement of a 3:5 up rate converter according to the present invention.

The rate converter according to the present invention is configured as shown in the block diagram of FIG. 21.

With the fifth embodiment, shown in FIG. 21, the present invention is applied to a 5:3 down rate converter for converting the $f_{SH}$ rate input data $\{X_m\}$ into $F_{SL}$ rate output data $\{Y_n\}$. The rate converter comprises transversal filter 270 having its input terminal 260 supplied with the $f_{SH}$ rate input data, five coefficient generators 280A, 280B, 280C, 280D and 280E for outputting respective filter coefficients to the transversal filter 270, and a thinning circuit 290 for thinning the $f_{SH}$ rate data $\{Y_i\}$ filtered by the transversal filter 270 to the $f_{SL}$ rate for outputting $f_{SL}$ output data $\{Y_m\}$ at an output terminal 295.

In the present fifth embodiment, the coefficient generators 280A, 280B, 280C, 280D and 280E sequentially output the filter coefficients at the $f_{SH}$ rate. Of these, the first coefficient generator 280A repeatedly generates the filter coefficients $k_0$, 0, $k_1$, 0, $k_2$ at the $f_{SH}$ rate. The second coefficient generator 280B repeatedly generates the filter coefficients $k_5$, $k_3$, 0, $k_4$, 0 at the $f_{SH}$ rate, while the third coefficient generator 280C repeatedly generates the filter coefficients 0, $k_8$, $k_6$, 0, $k_7$ at the $f_{SH}$ rate. The fourth coefficient generator 280D repeatedly generates the filter coefficients $k_{10}$, 0, $k_{11}$, $k_9$, 0 at the $f_{SH}$ rate, while the fifth coefficient generator 280E repeatedly generates the filter coefficients 0, $k_{13}$, 0, $k_{14}$, $k_{12}$ at the $f_{SH}$ rate.

The transversal filter 270 processes the $f_{SH}$ rate input data $\{X_m\}$ input data, supplied thereto via the input terminal 260, by rate-converting filtering, based on the filter coefficients sequentially supplied from the five coefficient generators 280A, 280B, 280C, 280D and 280E. This transversal filter 270 is a register postfix type or transposed type transversal filter made up of five multipliers 271A, 271B, 271C, 271D and 271E, five delay circuits 272A, 272B, 272C, 272D and 272E and four additive units 273A, 273B, 273C and 273D. The $f_{SH}$ rate input data are supplied via the input terminal 260 simultaneously to the five multipliers 271A, 271B, 271C, 271D and 271E.

Of the multipliers 271A, 271B, 271C, 271D and 271E, the first multiplier 271A is repeatedly supplied by the coefficient generator 280A with the filter coefficients $k_0$, 0, $k_1$, 0, $k_2$ at the $f_{SH}$ rate, and multiplies the $f_{SH}$ rate input data $\{X_m\}$ with the filter coefficients $k_0$, 0, $k_1$, 0, $k_2$ at the $f_{SH}$ rate. The output product data of the first multiplier 271A is fed to the additive unit 273A via the first delay circuit 272A.

The second multiplier 271B is repeatedly supplied by the coefficient generator 280B with the filter coefficients $k_5$, $k_3$, 0, $k_4$, 0 at the $f_{SH}$ rate, and multiplies the $f_{SH}$ rate input data $\{X_m\}$ with the filter coefficients $k_5$, $k_3$, 0, $k_4$, 0 at the $f_{SH}$ rate. The output product data of the second multiplier 271B is fed to the first additive unit 273A. The output sum data of the first additive unit 273A is fed via the second delay circuit 272B to the second additive unit 273B.

The third multiplier 271C is repeatedly supplied by the coefficient generator 280C with the filter coefficients 0, $k_8$, $k_6$, 0, $k_7$ at the $f_{SH}$ rate, and multiplies the $f_{SH}$ rate input data $\{X_m\}$ with the filter coefficients 0, $k_8$, $k_6$, 0, $k_7$ at the $f_{SH}$ rate. The output product data of the third multiplier 271C is fed to the second additive unit 273B. The output sum data of the second additive unit 273B is fed via the third delay circuit 272C to the second additive unit 273C.

The fourth multiplier 271D is repeatedly supplied by the coefficient generator 280D with the filter coefficients $k_{10}$, 0, $k_{11}$, $k_9$, 0 at the $f_{SH}$ rate, and multiplies the $f_{SH}$ rate input data $\{X_m\}$ with the filter coefficients $k_{10}$, 0, $k_{11}$, $k_9$, 0 at the $f_{SH}$ rate. The output product data of the fourth multiplier 271D is fed to the third additive unit 273C. The output sum data of the third additive unit 273C is fed via the fourth delay circuit 272D to the fourth additive unit 273D.

The fifth multiplier 271E is repeatedly supplied by the coefficient generator 280E with the filter coefficients 0, $k_{13}$, 0, $k_{14}$, $k_{12}$ at the $f_{SH}$ rate, and multiplies the $f_{SH}$ rate input data $\{X_m\}$ with the filter coefficients 0, $k_{13}$, 0, $k_{14}$, $k_{12}$ at the $f_{SH}$ rate. The output product data of the fourth multiplier 271D is fed to the fourth additive unit 273D. The output sum data of the fourth additive unit 273D is outputted via the fifth delay circuit 272E.

The thinning circuit 290 thins the $f_{SH}$ rate filter output data of the transversal filter 270 to the $f_{SL}$ rate to produce i=5n+1 data $\{Y_i\}$, that is, $$Y_1 = k_0 \cdot X_1 + k_3 \cdot X_2 + k_6 \cdot X_3 + k_9 \cdot X_4 + k_{12} \cdot X_5$$

$$Y_6 = k_1 \cdot X_3 + k_4 \cdot X_4 + k_7 \cdot X_5 + k_{10} \cdot X_6 + k_{13} \cdot X_7$$

$$Y_{11} = k_2 \cdot X_5 + k_5 \cdot X_6 + k_8 \cdot X_6 + k_{11} \cdot X_7 + k_{14} \cdot X_8$$

$$Y_{16} = k_0 \cdot X_6 + k_3 \cdot X_7 + k_6 \cdot X_8 + k_9 \cdot X_9 + k_{12} \cdot X_{10}$$

as output data $\{Y_n\}$ converted from the $f_{SH}$ rate input data $\{X_m\}$ into the $F_{SL}$ rate, where data are sequentially outputted at the output terminal 295.

The output data $\{Y_n\}$ produced at the output terminal 295 is equivalent to $F_{SL}$ rate data ($f_{SL}$=3/5 $f_{SH}$) generated by filtering 3 $F_{SL}$ rate data, generated by inserting four 0s between data of the $f_{SH}$ rate input data $\{X_m\}$, by a transversal filter operating at the 5 $f_{SH}$ rate, and extracting every third data.

The delay circuits 272A, 272B, 272C, 272D and 272E apply unit delay quantities at the $f_{SH}$ rate data to the $f_{SH}$ rate data and respectively comprise D-flipflops performing a latch operation at the $f_{SH}$ rate. The fifth delay circuit 242E simply latches the $f_{SH}$ rate output data $\{Y_i\}$ at an output stage and is not indispensable in the resister postfix type transversal filter.

With the present fifth embodiment, N:M=5:3 down rate conversion is carried out, where M−N=2. However, a down rate conversion by M:N, where M>N, may also be performed, with M−N being an arbitrary integer.

With the rate converter of the present invention, described above, the $f_{SH}$ rate input data $\{X_m\}$ is filtered by a register postfix type transversal filter and subsequently thinned by a thinning circuit for achieving down rate conversion of M:N (M>N) for generating $f_{SL}$ rate output data $\{Y_n\}$ from the $f_{SH}$ rate input data $\{X_m\}$.

The register postfix type transversal filters 240, 270 of the rate converters of the fourth and fifth embodiments are similarly configured to each other. In addition, the filter coefficients generated by the coefficient generators 230A to 230E and 280A to 280E are the same coefficients except that the output sequence is different. Thus the rate converter for bidirectional rate conversion may be simply implemented by employing a register prefix type transversal filter in common.

Figure 22:
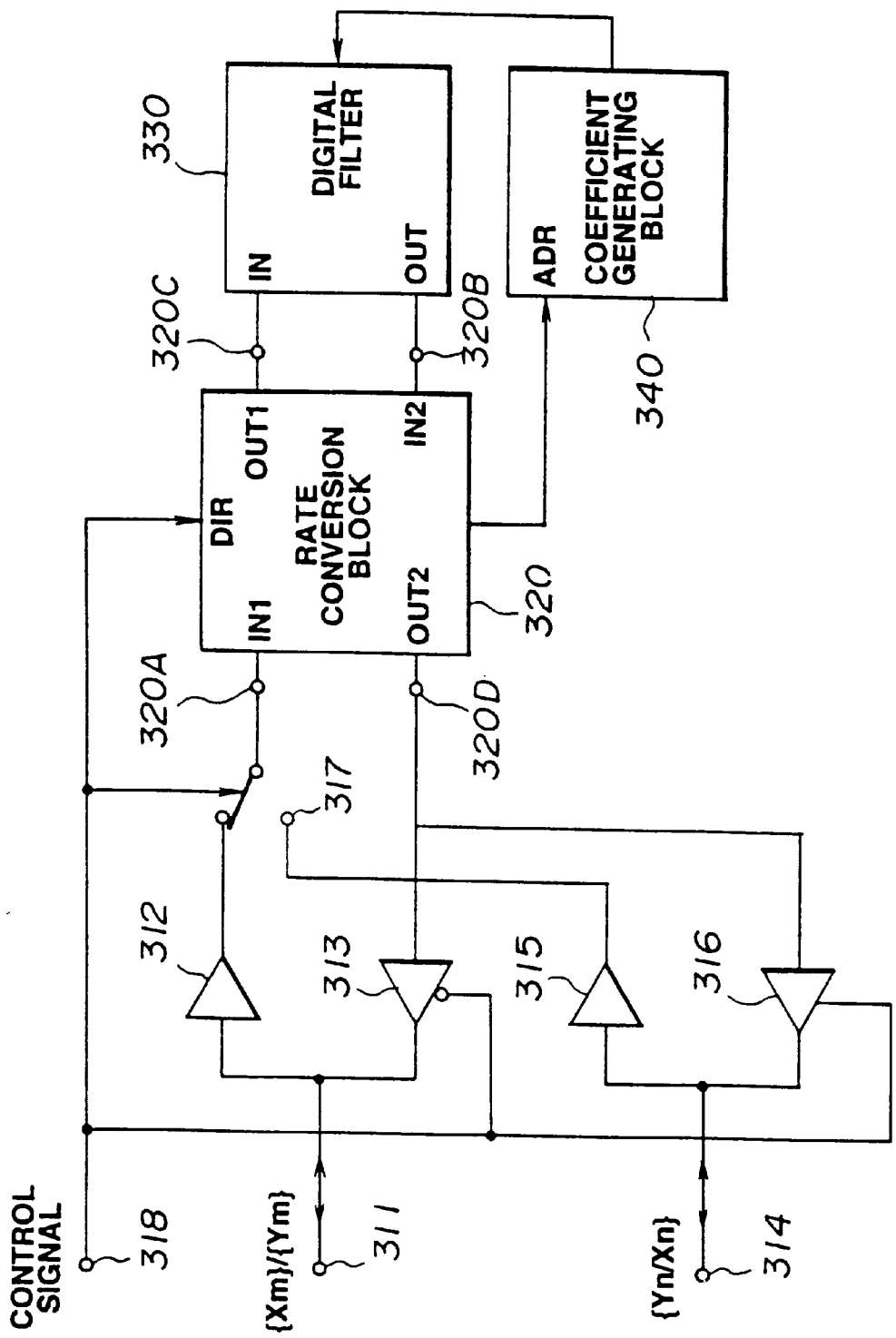
FIG. 22 is a block diagram showing an arrangement of a bidirectional rate converter according to the present invention.

FIG. 22 shows, in a block diagram, an arrangement of a bidirectional rate converter according to the present invention.

In the sixth embodiment, shown in FIG. 22, the present invention is applied to a bidirectional rate converter for performing a N:M (N<M) up rate conversion of converting the $f_{SL}$ rate input data $\{X_n\}$ into $f_{SH}$ rate output data $\{Y_m\}$ and a M:N (M>N) down rate conversion of converting the $f_{SH}$ rate input data $\{X_m\}$ into $f_{SL}$ rate output data $\{Y_n\}$. The rate converter of the present embodiment comprises a rate conversion block 320, a digital filter block 330 and a filter coefficient generating block 340.

The rate converter has a first input/output terminal 311 connected to a bidirectional bus for transmitting the $f_{SH}$ rate data and a second input/output terminal 312 connected to a bidirectional bus for transmitting the $F_{SL}$ rate data. An input end of the line receiver 312 and an output end of a line driver 313 are connected to the first input/output terminal 311, while an input end of a line receiver 315 and an output end of a line driver 316 are connected to the second input/output terminal 314.

The rate converting block 320 has first and second input terminals 320A, 320B and first and second output terminals 320C, 320D.

To the first input terminal 320A of the rate converting block 320A of the rate converting block 320, output ends of the line receivers 312, 315 are connected via a changeover switch 317. The changeover switch 317 is controlled by a control signal supplied via a terminal 318 for selecting the output end of the line receiver 312 during the down rate conversion mode and for selecting the output end of the line receiver 315 during the up rate conversion mode. This causes the $f_{SH}$ rate input data $\{X_m\}$ to be supplied from the first input/output terminal 311 via the changeover switch 317 during the down rate conversion mode, while causing the $F_{SL}$ rate input data $\{X_n\}$ to be supplied from the second input/output terminal 314 via the changeover switch 317 during the up rate conversion mode.

The rate conversion block 320 has its first output terminal 320C connected to an input terminal of the digital filter block 330, an output terminal of which is connected to the second input terminal 320B of the rate converting block 320.

The second output terminal 320D of the rate converting block 320 is connected via the line driver 313 to the first input/output terminal 311, while being connected to the second input/output terminal 314 via the line driver 316. The line drivers 313, 316 are controlled by the control signal supplied via the terminal 318 so that the line driver 315 becomes operative wit the line driver 313 remaining inoperative and the line driver 313 becomes operative with the line driver 315 remaining inoperative during the down rate conversion mode and during the up rate conversion mode, respectively. Thus the converted output data $\{Y_n\}$ of the $f_{SL}$ obtained at the second output terminal 320D of the rate conversion block 320 is outputted at the second output terminal 314 during the down rate conversion mode, while the converted output data $\{Y_m\}$ of the $f_{SH}$ rate is outputted at the first input/output terminal 311 during the up rate conversion mode.

The rate conversion block 320 is controlled by the control signal supplied via the terminal 318 so as to perform thinning during the down rate conversion mode for converting the $f_{SH}$ rate input data $\{X_n\}$ supplied to the first input terminal 320A from the first input/output terminal 311 via the changeover switch 317 into $f_{SL}$ rate output data $\{Y_n\}$, and so as to perform interpolation during the up rate conversion mode for converting the $f_{SL}$ rate input data $\{X_n\}$ supplied to the first input terminal 320A from the first input/output terminal 311 via the changeover switch 317 into $f_{SH}$ rate output data $\{Y_m\}$.

Figure 23:
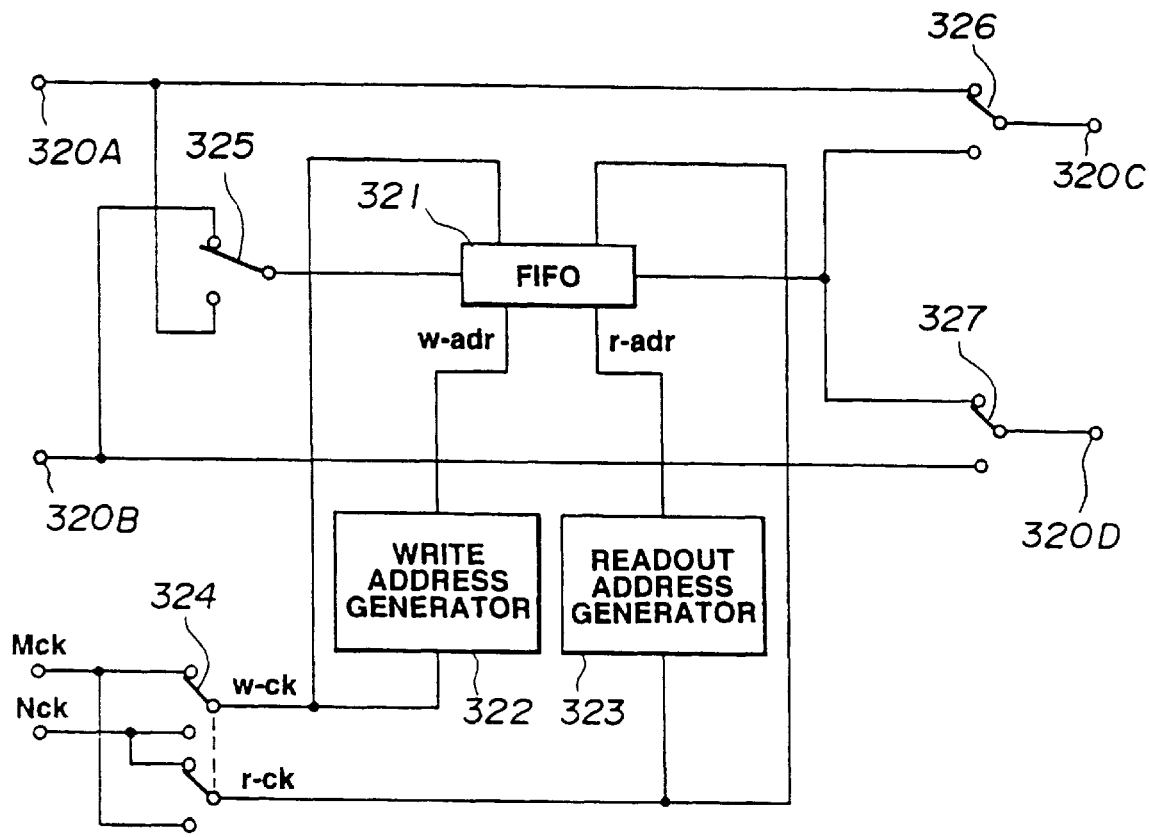
FIG. 23 is a block diagram showing a practical arrangement of a rate conversion block in the above bidirectional rate converter.

Referring to the block diagram of FIG. 23, the rate converting block 320 includes a FIFO memory 321, a write address generator 322 for applying a write address w-adr to the FIFO memory 321 and a readout address generator 323 for applying the readout address r-adr to the FIFO memory 321. The rate converting block also includes a switch 324 for changing over the write clock w-ck and the readout clock r-ck applied to the FIFO memory 321, and a changeover switch 325 for selectively connecting the first input terminal 320A and the second input terminal 320B to the data input terminal of the FIFO memory 321.

The rate converting block further includes a changeover switch 326 for selectively connecting the first input terminal 320A and a data output end of the FIFO memory 321 to the first output terminal 320C and a changeover switch 327 for selectively connecting the second input terminal 320B and the data output end of the FIFO memory 321 to the first output terminal 320C.

During the down rate conversion mode, the changeover switch 324 changes over the $F_{SL}$ rate clock $N_{CK}$ to the $f_{SH}$ rate clock $M_{CK}$ and vice versa for applying the $f_{SH}$ rate clock $M_{CK}$ as the write clock w-ck to the FIFO memory 321 and the write address generator 322 and for applying the $F_{SL}$ rate clock $N_{CK}$ as the readout clock r-adr to the FIFO memory 321 and the readout address generator 323, while applying the $F_{SL}$ rate clock $N_{CK}$ as the write clock w-ck to the FIFO memory 321 and the write address generator 322 and for applying the $f_{SH}$ rate clock $M_{CK}$ as the readout address r-adr to the FIFO memory 321 and the readout address generator 323.

The changeover switches 325, 326, 327 execute the following changeover operations.

That is, during the down rate conversion mode, the changeover switch 325 selects the second input terminal 320B, while the changeover switch 326 selects the first input terminal 320A and the changeover switch 327 selects the data output terminal of the FIFO memory 321. During the down rate conversion mode, the changeover switch 325 selects the first input terminal 320A, while the changeover switch 326 selects the data output terminal of the FIFO memory 321 and the changeover switch 327 selects the first input terminal 320B.

With the above-described rate converting block 320, the $f_{SH}$ rate input data $\{X_m\}$ is supplied during the down rate conversion mode from the first output terminal 320C via the changeover switch 326 to the digital filter block 330, and the $f_{SH}$ rate data $\{Y_i\}$ supplied via the digital filter block 330 to the second input terminal 320B is supplied via the changeover switch 325 to the data input terminal of the FIFO memory 321. The $f_{SH}$ rate data $\{Y_i\}$ is written in the FIFO memory 321 in accordance with the write address w-adr generated by the write address generator 322 based on the $f_{SH}$ rate write clock w-ck, while being read out as the $F_{SL}$ rate output data $\{Y_n\}$ from the FIFO memory 321 in accordance with the read address r-adr generated by the read address generator 323 based on the $f_{SL}$ rate readout clock r-ck. That is, thinning is carried out by reading by skipping addresses for unnecessary (M−N) data of the M data contained in the $f_{SH}$ rate data $\{Y_i\}$ for outputting $F_{SL}$ output data $\{Y_n\}$ at the second output terminal 320D.

During the up rate conversion mode, the $f_{SL}$ rate input data $\{X_n\}$ supplied to the first input terminal 320A is written in the FIFO memory 321 in accordance with the write address w-adr generated by the write address generator 322 based on the $F_{SL}$ rat write cock w-ck, and is read out from the FIFO memory 321 in accordance with the read address r-adr generated by the read address generator 323 based on the $f_{SL}$ rate read clock r-ck, for conversion into $f_{SH}$ rate data, which is supplied from the first output terminal 320C to the digital filter block 330. That is, interpolation is performed in place of zero insertion by reading out (M−N) data of N data of the input data $\{X_n\}$ written in the FIFO memory 321 from the same address for generating $f_{SH}$ rate data which is supplied to the digital filter block 330. The $f_{SH}$ rate output data $\{Y_i\}$ supplied via the digital filter block 330 to the second input terminal 320B is outputted to the second output terminal 320D as output data $\{Y_m\}$ via the second changeover switch 327.

Figure 24:
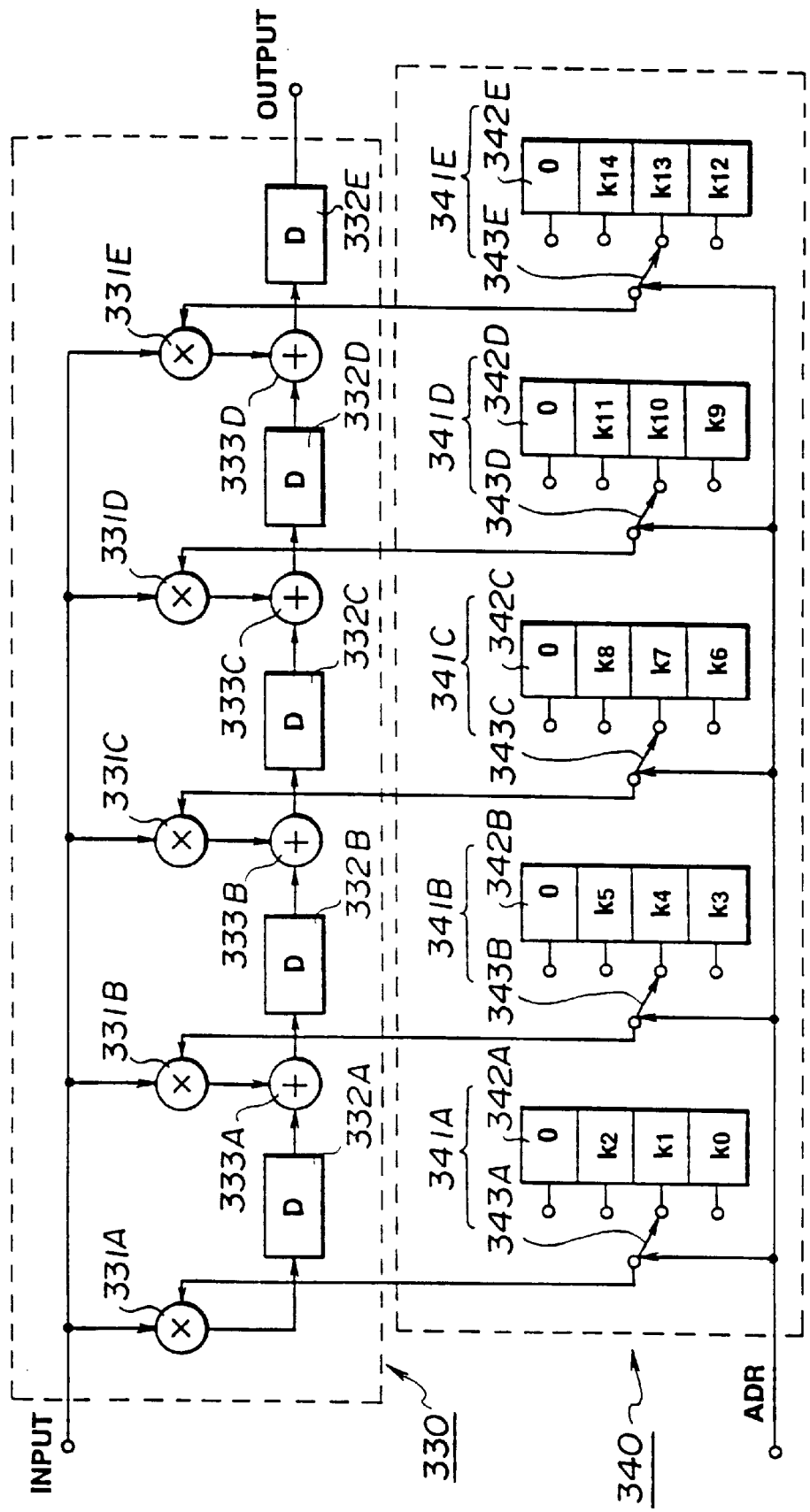
FIG. 24 is a block diagram showing a practical arrangement of a digital filter block in the above bidirectional rate converter.

The digital filter block 330 and the coefficient generating block 340 are configured as shown for example in FIG. 24.

This transversal filter 330 is a register postfix type transversal filter made up of five multipliers 331A, 331B, 331C, 331D and 331E, five delay circuits 332A, 332B, 332C, 332D and 332E and four additive units 333A, 333B, 333C and 333D. The output data, generated by the rate conversion block 120, are simultaneously supplied to the five multipliers 331A, 331B, 331C, 331D and 331E.

Of the multipliers 331A, 331B, 331C, 331D and 331E, the first multiplier 331A multiplies the output of the rate converting block 320 with the filter coefficients repeatedly supplied thereto at the $f_{SH}$ rate by the first coefficient generator 340A of the coefficient generating block 340. The product output data of the first multiplier 331A is supplied via the first delay circuit 332A to the first additive unit 333A.

The second multiplier 331B multiplies the output of the rate converting block 320 with the filter coefficients repeatedly supplied thereto at the $f_{SH}$ rate by the second coefficient generator 341B of the coefficient generating block 340. The output product data of the second multiplier 331B is fed to the first additive unit 333A. The sum output data of the first additive node 333A is fed via the second delay circuit 332B to the second additive node 333B.

The third multiplier 331C multiplies the output of the rate converting block 320 with the filter coefficients repeatedly supplied thereto at the $f_{SH}$ rate by the second coefficient generator 341C of the coefficient generating block 340. The output product data of the third multiplier 331C is fed to the second additive unit 333B. The sum output data of the second additive node 333B is fed via the third delay circuit 332C to the third additive node 333C.

The fourth multiplier 331D multiplies the output of the rate converting block 320 with the filter coefficients repeatedly supplied thereto at the $f_{SH}$ rate by the fourth coefficient generator 341C of the coefficient generating block 340. The output product data of the fourth multiplier 331D is fed to the third additive unit 333C. The sum output data of the fourth additive node 333D is fed via the fourth delay circuit 332D to the fourth additive node 333D.

The fifth multiplier 331E multiplies the output of the rate converting block 320 with the filter coefficients repeatedly supplied thereto at the $f_{SH}$ rate by the fifth coefficient generator 341E of the coefficient generating block 340. The output product data of the fifth multiplier 331E is fed to the fourth additive unit 333D. The sum output data of the fourth additive node 333A is fed via the fifth delay circuit 332E to the second input terminal 320B of the digital filter block 330 as a filter output.

The coefficient generating block 340 comprises five coefficient generators 341A, 341B, 341C, 341D and 341D.

The first coefficient generator 341A of the coefficient generating block 340 has a coefficient memory 342A for storing filter coefficients $k_0, k_1, k_2, 0$ and a selector 343A for selectively outputting the coefficients $k_0, k_1, k_2, 0$ from the coefficient memory 342A. The selector 343A executes its selecting operation responsive to the address data ADR supplied from an address generator, not shown, and repeatedly outputs the filter coefficients $k_0, 0, k_1, 0$ and $k_2$, at the $f_{SH}$ rate during the down rate conversion mode, while repeatedly outputting the filter coefficients $k_0, k_2, 0, k_1, 0$ at the $f_{SH}$ rate during the up rate conversion mode.

The second coefficient generator 341B has a coefficient memory 342B for storing filter coefficients $k_3, k_4, k_5, 0$ and a selector 343B for selectively outputting the coefficients $k_3, k_4, k_5, 0$ from the coefficient memory 342B. The selector 343B executes its selecting operation responsive to the address data ADR supplied from an address generator, not shown, and repeatedly outputs the filter coefficients $k_5, k_3, 0, k_4, 0$ at the $f_{SH}$ rate during the down rate conversion mode, while repeatedly outputting the filter coefficients $k_3, k_5, 0, k_4, 0$ at the $f_{SH}$ rate during the up rate conversion modes.

The third coefficient generator 341C has a coefficient memory 342C for storing filter coefficients $k_6, k_7, k_8, 0$ and a selector 343C for selectively outputting the coefficients $k_6, k_7, k_8, 0$ from the coefficient memory 342C. The selector 343C executes its selecting operation responsive to the address data ADR supplied from an address generator, not shown, and repeatedly outputs the filter coefficients 0, $k_8$, $k_6$, 0, $k_7$ at the $f_{SH}$ rate during the down rate conversion mode, while repeatedly outputting the filter coefficients $k_6$, $k_8$, 0, $k_7$, 0 at the $f_{SH}$ rate during the up rate conversion mode.

The fourth coefficient generator 341D has a coefficient memory 342D for storing filter coefficients $k_9$, $k_{10}$, $k_{11}$, 0 and a selector 343D for selectively outputting the coefficients $k_9$, $k_{10}$, $k_{11}$, 0 from the coefficient memory 342D. The selector 343D executes its selecting operation responsive to the address data ADR supplied from an address generator, not shown, and repeatedly outputs the filter coefficients $k_{10}$, 0, $k_{11}$, $k_9$, 0 at the $f_{SH}$ rate during the down rate conversion mode, while repeatedly outputting the filter coefficients $k_9$, $k_{11}$, 0, $k_{10}$, 0 at the $f_{SH}$ rate during the up rate conversion mode.

The fifth coefficient generator 341E has a coefficient memory 342E for storing filter coefficients $k_{12}$, $k_{13}$, $k_{14}$, 0 and a selector 343E for selectively outputting the coefficients $k_{12}$, $k_{13}$, $k_{14}$, 0 from the coefficient memory 342E. The selector 343E executes its selecting operation responsive to the address data ADR supplied from an address generator, not shown, and repeatedly outputs the filter coefficients 0, $k_{13}$, 0, $k_{14}$, $k_{12}$ at the $f_{SH}$ rate during the down rate conversion mode, while repeatedly outputting the filter coefficients $k_{12}$, $k_{14}$, 0, $k_{13}$, 0 at the $f_{SH}$ rate during the up rate conversion mode.

With the above-described rate converter, the $f_{SL}$ rate converted output data $\{Y_n\}$ can be outputted via the second input/output terminal 314 during the down rate conversion mode by executing 5:3 down rate conversion by performing thinning by the rate conversion block 320 for filtering the $f_{SH}$ rate input data $\{X_m\}$ supplied to the first input/output terminal 311 by the digital filter block 330 for converting the input data into $f_{SL}$ rate output data $\{Y_n\}$. On the other hand, the $f_{SL}$ rate converted output data $\{Y_m\}$ can be outputted via the second input/output terminal 314 during the up rate conversion mode by executing 3:5 up rate conversion by performing interpolation by the rate conversion block 320 for converting the $f_{SL}$ rate input data $\{X_n\}$ supplied via the first input terminal 311 and by filtering by the digital filter block 330.

What is claimed is:

1. A rate converter for converting an $f_{SH}$ input data rate of an input signal to an $f_{SL}$ output data rate, wherein said input data rate $f_{SH}$ and said output data rate $f_{SL}$ are in an M:N conversion ratio with each other with M and N being integers and M>N, comprising:

a postfix type transversal filter comprising:

coefficient generating means for generating M sequences of filter coefficients, said filter coefficients in each sequence being generated at the $f_{SH}$ input data rate;

M multiplying means for multiplying said input signal by each sequence of filter coefficients, producing a result for each sequence;

delay and summation means for delaying a respective result of said multiplying means and consecutively summing and delaying said delayed respective results with each remaining result of said multiplying means; and a thinning circuit for thinning and down-converting the $f_{SH}$ input data rate to said output $f_{SL}$ output data rate.

2. The rate converter as claimed in claim 1 wherein N+1:N down rate conversion is performed by setting M=N+1.

* * * * *